United States Patent
Maeda

(10) Patent No.: US 6,248,657 B1
(45) Date of Patent: Jun. 19, 2001

(54) SEMICONDUCTOR DEVICE AND METHOD FOR MANUFACTURING THE SAME

(75) Inventor: Shigenobu Maeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/500,008

(22) Filed: Feb. 8, 2000

Related U.S. Application Data

(62) Division of application No. 09/139,412, filed on Aug. 25, 1998.

(30) Foreign Application Priority Data

Mar. 13, 1998 (JP) .................................................. 10-063046

(51) Int. Cl.$^7$ .................................................. H01L 21/44
(52) U.S. Cl. .................................................. 438/612; 438/459
(58) Field of Search .................................................. 438/459, 464, 438/612, 613, 614, 615, 151, 152; 437/194, 211, 217, 62, 51

(56) References Cited

U.S. PATENT DOCUMENTS

| | | | |
|---|---|---|---|
| 4,855,257 | * 8/1989 | Kouda | 437/194 |
| 5,113,236 | 5/1992 | Arnold et al. | 257/347 |
| 5,235,212 | 8/1993 | Shimizu et al. | 257/780 |
| 5,324,678 | * 6/1994 | Kusumoki | 438/459 |
| 5,365,112 | 11/1994 | Ohshima | 257/784 |
| 5,382,818 | 1/1995 | Pein | 257/347 |
| 5,539,244 | 7/1996 | Mori et al. | 257/784 |
| 5,567,968 | 10/1996 | Tsuruta et al. | 257/356 |
| 5,587,598 | 12/1996 | Hatanaka | 257/355 |
| 5,700,735 | 12/1997 | Shine et al. | 438/612 |
| 5,719,448 | 2/1998 | Ichikawa | 257/781 |
| 5,739,591 | 4/1998 | Dekker et al. | 257/780 |
| 5,773,899 | 6/1998 | Zambrano | 257/784 |
| 5,814,893 | 9/1998 | Hsu et al. | 257/784 |
| 5,841,172 | 11/1998 | Morishita et al. | 257/355 |
| 5,854,085 | * 12/1998 | Raab et al. | 437/211 |
| 5,989,992 | * 11/1999 | Yabu et al. | 438/612 |

FOREIGN PATENT DOCUMENTS

| | | |
|---|---|---|
| 0 177 692 A2 | 4/1986 | (EP) . |
| 0 622 850 A1 | 11/1994 | (EP) . |
| 0 838 857 A2 | 4/1998 | (EP) . |
| 5-291571 | 11/1993 | (JP) . |
| 7-7820 | 1/1995 | (JP) . |
| 7-202077 | 8/1995 | (JP) . |
| 08088323 | 2/1996 | (JP) . |

OTHER PUBLICATIONS

Japanese Office Action dated Aug. 31, 2000.
ULSI DRAM Technology, Sep. 25, 1992, p. 67.

* cited by examiner

Primary Examiner—David Nelms
Assistant Examiner—Phuc T. Dang
(74) Attorney, Agent, or Firm—McDermott, Will & Emery

(57) ABSTRACT

A semiconductor device for protecting an electronic circuit from a surge and a method for manufacturing the semiconductor device are obtained. The semiconductor device comprises a p-type semiconductor substrate 13, an insulator 14 enclosing a SOI layer 111 on which an electronic circuit is formed, and provided on the semiconductor substrate 13, a bonding pad 121 conducted to the SOI layer 111 through a wiring 113, and a bonding region 12 including the bonding pad 121 and an opening 122 having a bottom to which the semiconductor substrate 13 is exposed. A bonding wire 3 is bonded to the bonding region 12.

4 Claims, 33 Drawing Sheets

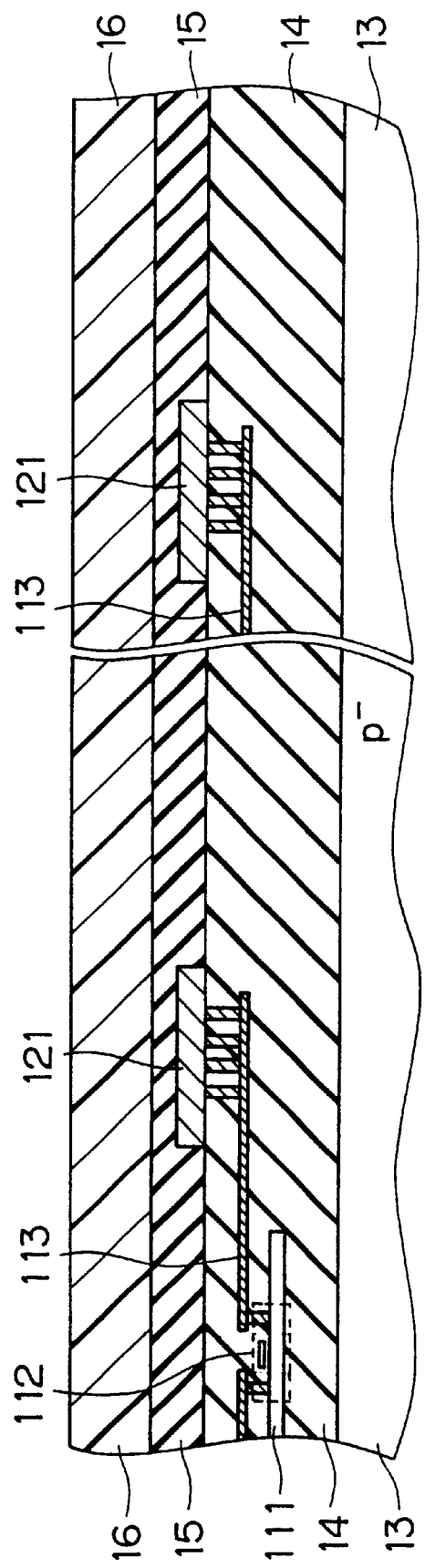

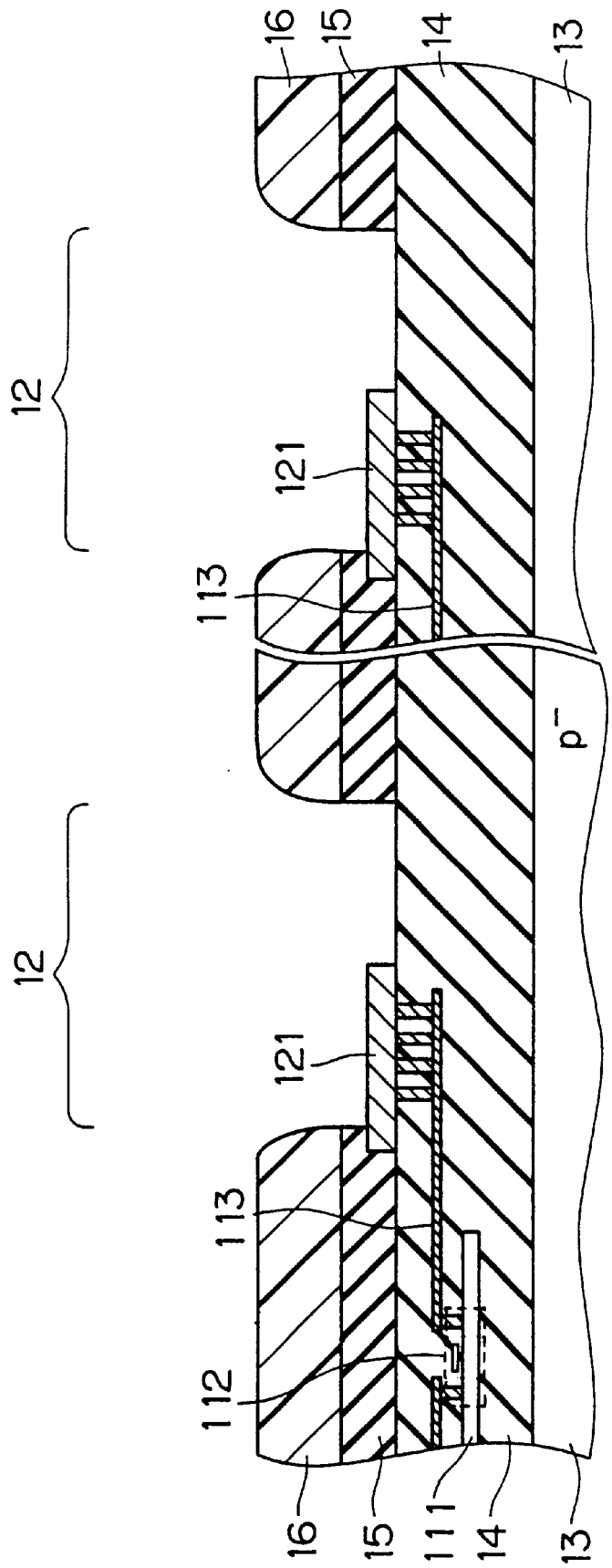

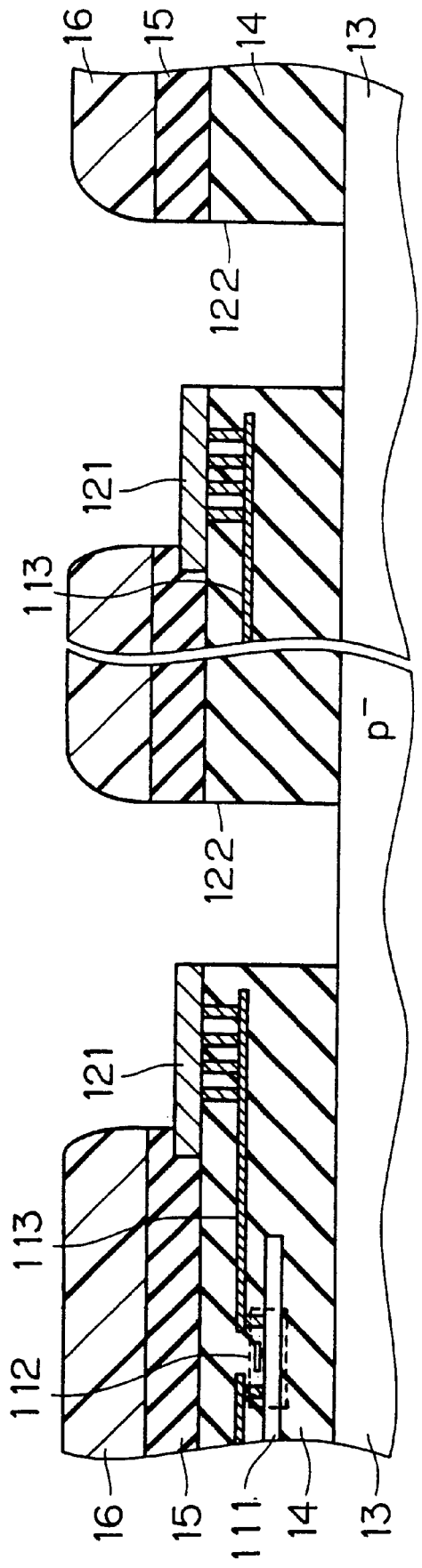

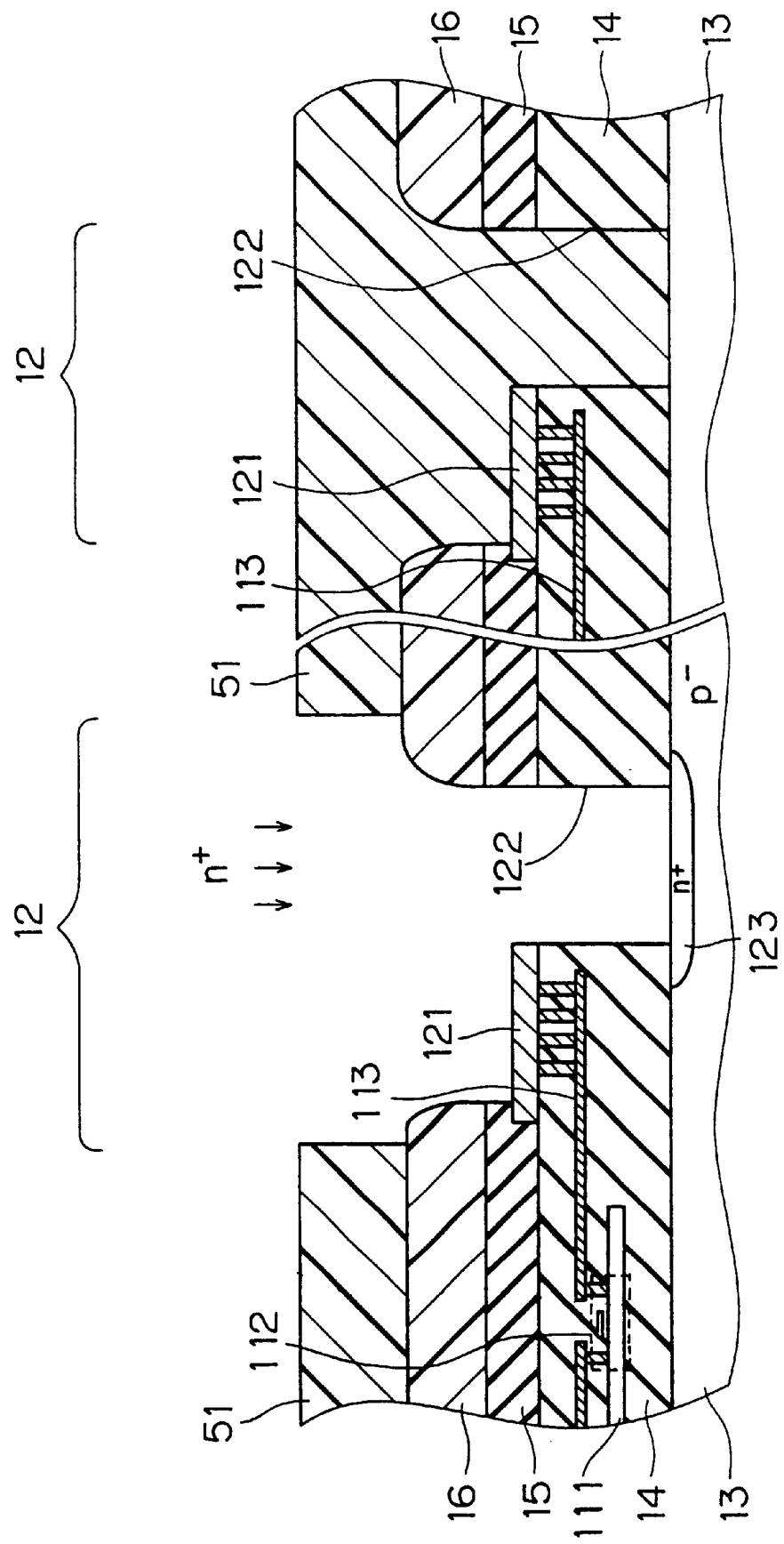

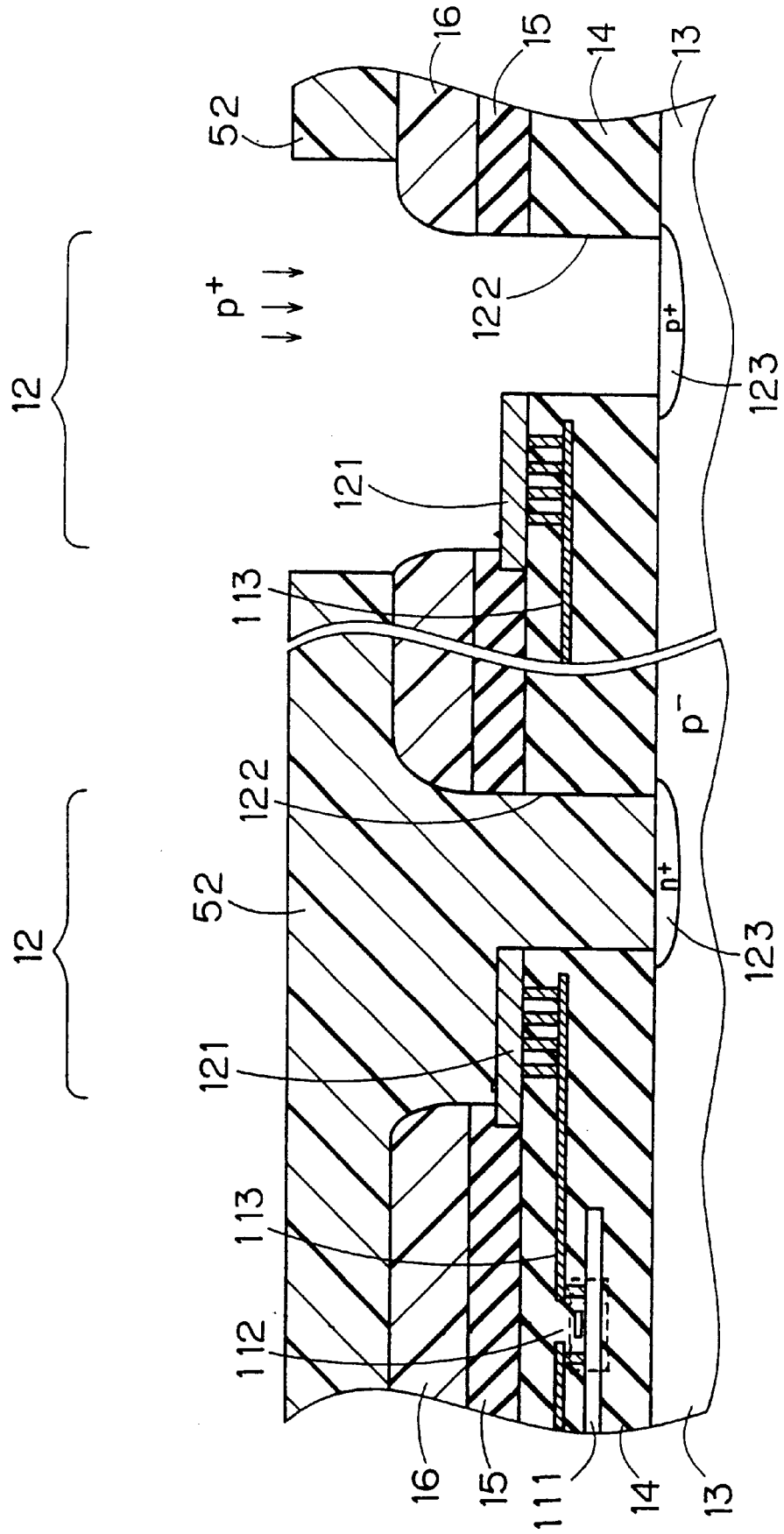

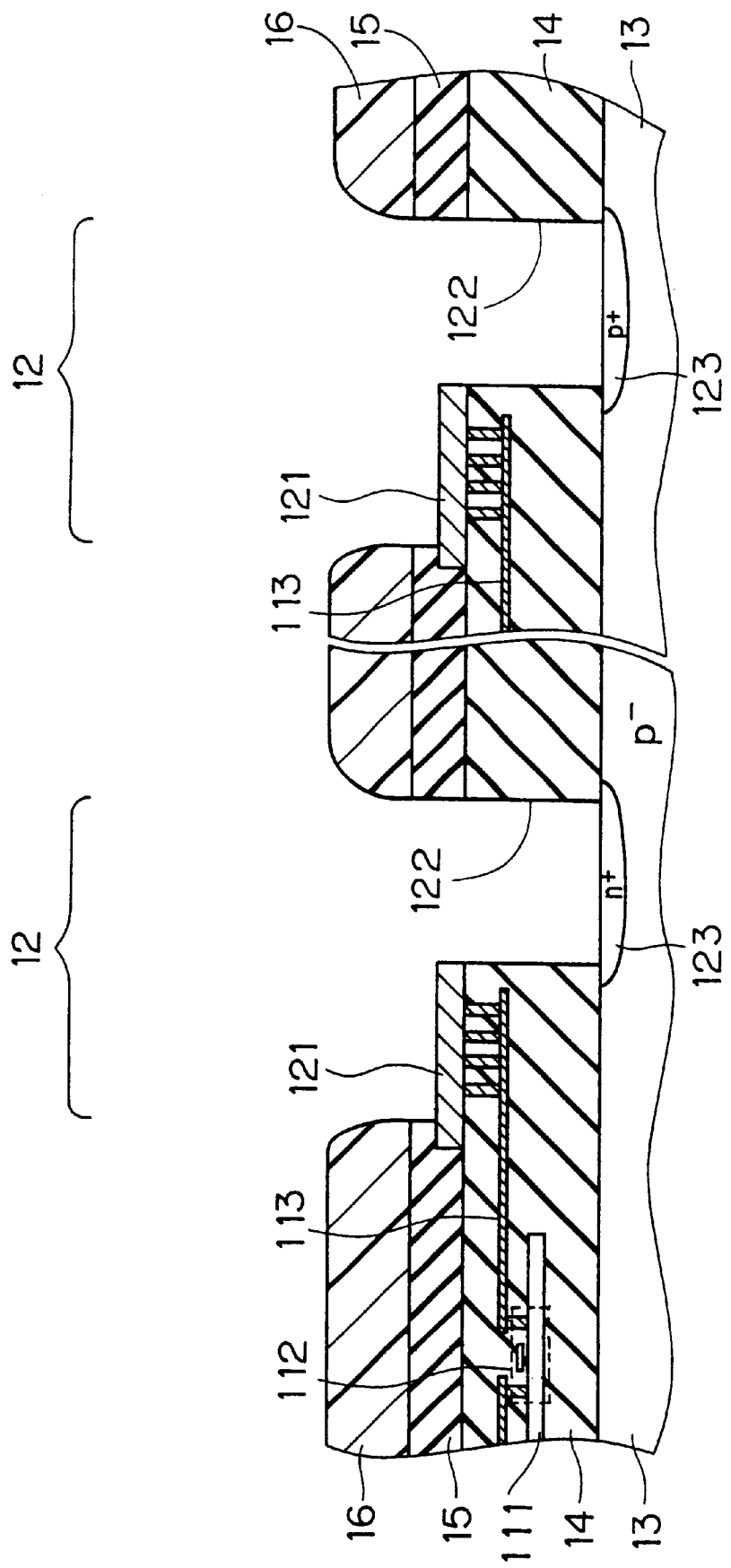

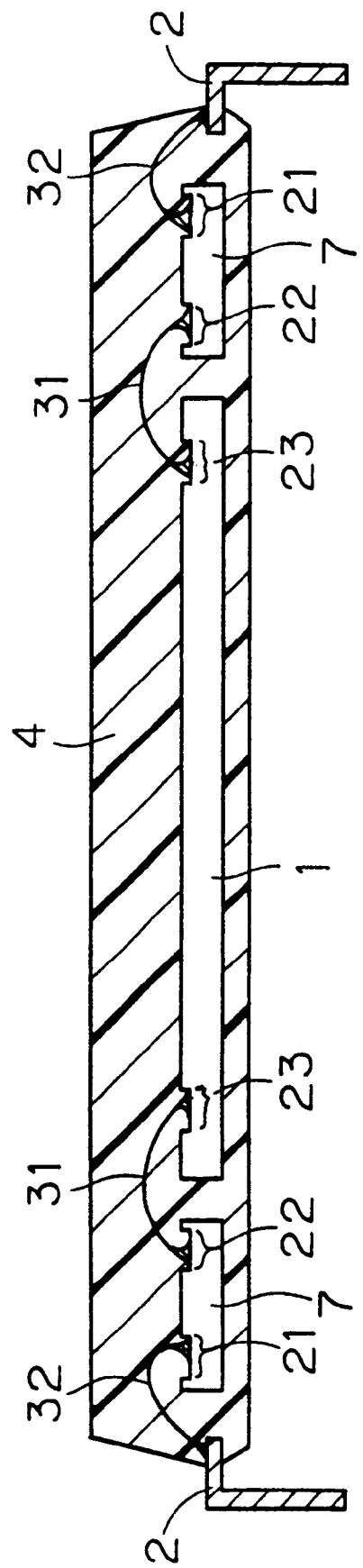
F I G. 32

SEMICONDUCTOR DEVICE AND METHOD FOR MANUFACTURING THE SAME

This application is a divisional of application Ser. No. 09/139,412 filed Aug. 25, 1998.

BACKGROUND OF THE INVENTION

1. Field of the Invention

The present invention relates to a semiconductor device comprising an electronic circuit and a method for manufacturing the semiconductor device, and more particularly to electrical protection for the electronic circuit.

2. Description of the Background Art

In a semiconductor device according to the prior art, a surge caused by static electricity is sometimes propagated with a high voltage or a great current to an electronic circuit provided therein.

Accordingly, there has been a problem that the electronic circuit provided in the semiconductor device is broken by the surge. In a semiconductor device having a SOI (Silicon On Insulator) structure, particularly, an electronic circuit provided therein is easily broken by the surge. FIG. 33 shows an example of a section of the semiconductor device having the SOI structure. In FIG. 33, the reference numeral 13 denotes a p-type semiconductor region in a SOI substrate (hereinafter referred to as a semiconductor substrate), the reference numeral 111 denotes a SOI layer (semiconductor layer), the reference numeral 14 denotes a buried oxide film, and the reference numeral 112 denotes a MOS transistor provided on the SOI layer 111 and forming an electronic circuit, a gate G, a source S and a drain D being shown. The buried oxide film 14 has a very poor thermal conductivity. For example, $SiO_2$ has a thermal conductivity of about one hundredth as compared with single crystal Si. Consequently, when the surge is propagated between the source S and the drain D, the temperatures of the source S and the drain D are raised so that the source S and the drain D are easily broken.

SUMMARY OF THE INVENTION

A first aspect of the present invention is directed to a semiconductor device comprising a semiconductor substrate, an electronic circuit provided on the semiconductor substrate, a terminal conducted to the electronic circuit, and a metal connecting member bonded, in common, to both the terminal and a region of a surface of the semiconductor substrate which is exposed adjacently to the terminal, a diode having the surface of the semiconductor substrate as one of electrodes being formed between the connecting member and the semiconductor substrate.

A second aspect of the present invention is directed to the semiconductor device wherein the metal forms a Schottky junction together with the region.

A third aspect of the present invention is directed to the semiconductor device wherein the region has a conductivity type which is reverse to a conductivity type of the semiconductor substrate.

A fourth aspect of the present invention is directed to the semiconductor device, further comprising an insulating film formed between the semiconductor substrate and the terminal, enclosing the electronic circuit, and exposed adjacently to the terminal together with the region, and a conductive member formed over the insulating film and the region.

A fifth aspect of the present invention is directed to the semiconductor device wherein the region is provided in a center of the terminal.

A sixth aspect of the present invention is directed to a semiconductor device comprising a semiconductor chip including a semiconductor substrate, an insulating film formed on the semiconductor substrate, and a semiconductor layer formed on the insulating film and having an electronic circuit formed thereon, a protective substrate for electrically protecting the semiconductor layer, an external terminal, a first connecting member for electrically connecting the semiconductor chip and the protective substrate, and a second connecting member for electrically connecting the protective substrate and the external terminal.

A seventh aspect of the present invention is directed to a method for manufacturing a semiconductor device, comprising the steps of (a) preparing a semiconductor substrate, an insulating film formed on the semiconductor substrate, a semiconductor layer formed on the insulating film and having an electronic circuit formed thereon, a terminal conducted to the electronic circuit, and an external terminal, (b) forming an opening on the insulating film to expose the semiconductor substrate, (c) connecting one of ends of a metal connecting member to the external terminal, and (d) bonding the other end of the connecting member to the exposed semiconductor substrate and the terminal.

An eighth aspect of the present invention is directed to the method for manufacturing a semiconductor device, further comprising, between the steps (b) and (c), a step of (e) making a conductivity type of a surface of the exposed semiconductor substrate different from that of the semiconductor substrate.

A ninth aspect of the present invention is directed to the method for manufacturing a semiconductor device, further comprising, between the steps (e) and (c), a step of (f) forming a conductive member from the surface of the exposed semiconductor substrate to a sidewall of the opening.

A tenth aspect of the present invention is directed to the semiconductor device wherein the electronic circuit is provided on a SOI structure.

An eleventh aspect of the present invention is directed to the method for manufacturing a semiconductor device wherein the electronic circuit is provided on a SOI structure.

A twelfth aspect of the present invention is directed to the semiconductor device wherein the electronic circuit is provided on a SOI structure.

According to the first aspect of the present invention, in a case where a surge is propagated from the connecting member to a bonding pad, it is sent to the semiconductor substrate through a diode. Accordingly, the electronic circuit can be protected from the surge.

According to the second aspect of the present invention, a Schottky type diode is formed between the connecting member and the surface of the semiconductor substrate. Therefore, the effects according to the first aspect of the present invention can easily be obtained.

According to the third aspect of the present invention, a PN junction type diode is formed on the surface of the semiconductor substrate. Therefore, a resistance is smaller during breakdown as compared with the Schottky type diode. Consequently, the surge can easily flow to the semiconductor substrate.

According to the fourth aspect of the present invention, when coming in contact with the bonding pad, it becomes harder for the connecting member to come in contact with the region to which the semiconductor substrate is exposed if a thickness of the insulating film is increased. However, if the conductive member is provided, the connecting member can be conducted to the semiconductor substrate.

According to the fifth aspect of the present invention, the region is provided in the center of the terminal. Consequently, even if the connecting member is bonded toward the periphery of the terminal, the connecting member can easily come in contact with the region.

According to the sixth aspect of the present invention, the semiconductor device in which the semiconductor layer having the electronic circuit formed thereon is insulated from the semiconductor substrate by the insulating film has very few paths through which a surge flows out of the semiconductor layer when the surge is propagated from the external terminal to the semiconductor layer. For this reason, the electronic circuit is easily broken by the surge. Therefore, the protective substrate is electrically provided between the external terminal and the semiconductor chip to prevent the surge from being propagated from the external terminal to the semiconductor chip. Consequently, the electronic circuit can be protected from the surge.

According to the seventh aspect of the present invention, generally, the electronic circuit formed on the insulating film discharges the surge with difficulty. However, the connecting member is connected to the external terminal at the step (c). Therefore, the surge flows to the external terminal even if it is generated during the bonding at the step (d). Therefore, the electronic circuit can be protected from the surge.

According to the eighth aspect of the present invention, the surge flows out through a PN junction type diode formed on the surface of the semiconductor substrate even if it is likely to flow from the connecting member to the electronic circuit. Consequently, the electronic circuit can be protected from the surge.

According to the ninth aspect of the present invention, even if the other end of the connecting member is bonded in such a manner that it reaches only the sidewall of the opening and does not reach the semiconductor substrate on a bottom of the opening, the effects according to the eighth aspect of the present invention can be obtained.

According to the tenth aspect of the present invention, the electronic circuit formed on the SOI structure can effectively be protected from the surge.

According to the eleventh aspect of the present invention, the electronic circuit formed on the SOI structure can effectively be protected from the surge.

According to the twelfth aspect of the present invention, the electronic circuit formed on the SOI structure can effectively be protected from the surge.

In order to solve the above-mentioned problem, it is an object of the present invention to provide a semiconductor device capable of protecting an electronic circuit formed therein from a surge and a method for manufacturing the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 12A and 12B are sectional view showing a method for manufacturing a semiconductor device according to a fifth embodiment of the present invention;

FIGS. 14A and 14B are sectional view showing the method for manufacturing the semiconductor device according to the fifth embodiment of the present invention;

FIGS. 15A and 15B are sectional view showing the method for manufacturing the semiconductor device according to the fifth embodiment of the present invention;

FIGS. 16A and 16B are sectional view showing the method for manufacturing the semiconductor device according to the fifth embodiment of the present invention;

FIGS. 17A and 17B are sectional view showing the method for manufacturing the semiconductor device according to the fifth embodiment of the present invention;

FIGS. 18A and 18B are sectional view showing the method for manufacturing the semiconductor device according to the fifth embodiment of the present invention;

FIG. 32 is a sectional view showing the semiconductor device according to the seventh embodiment of the present invention;

DESCRIPTION OF THE PREFERRED EMBODIMENTS

First Embodiment

Figure 1:
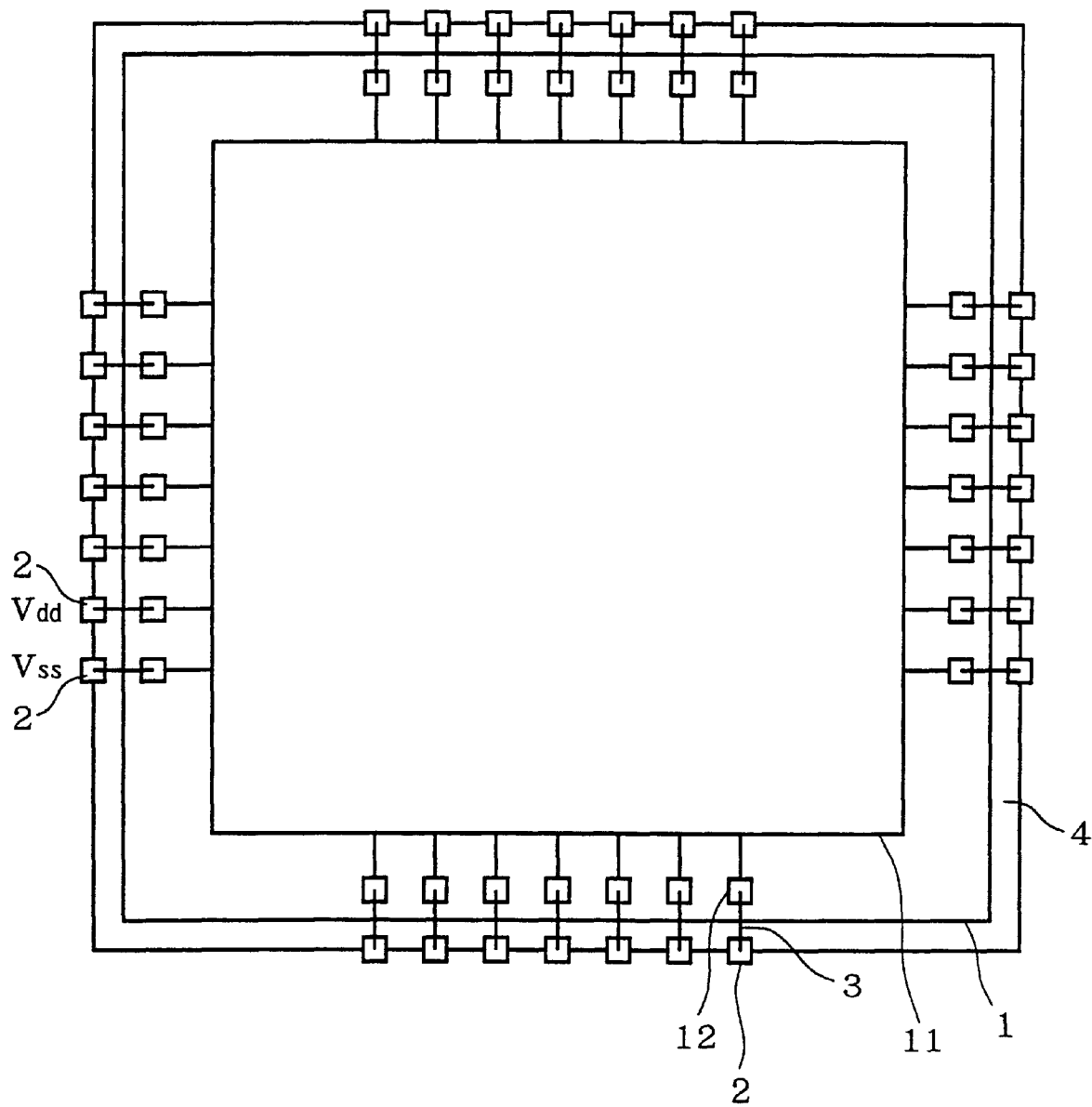
FIG. 1 is a conceptual view showing a semiconductor device according to a first embodiment of the present invention.

FIG. 1 is a conceptual view showing a structure of a semiconductor device according to a first embodiment of the present invention. In FIG. 1, the reference numeral 1 denotes a semiconductor chip having a SOI structure, and the reference numeral 11 denotes a region having a SOI layer which is provided on the semiconductor chip 1 (hereinafter referred to as a SOI region). An electronic circuit is formed in the SOI region 11. The reference numeral 12 denotes a region provided on the semiconductor chip 1 to which a bonding wire 3 (metal connecting member) is connected (hereinafter referred to as a bonding region), the reference numeral 2 denotes an external terminal connected to the bonding region 12 through the bonding wire 3, and the reference numeral 4 denotes a mold resin.

Figure 2:
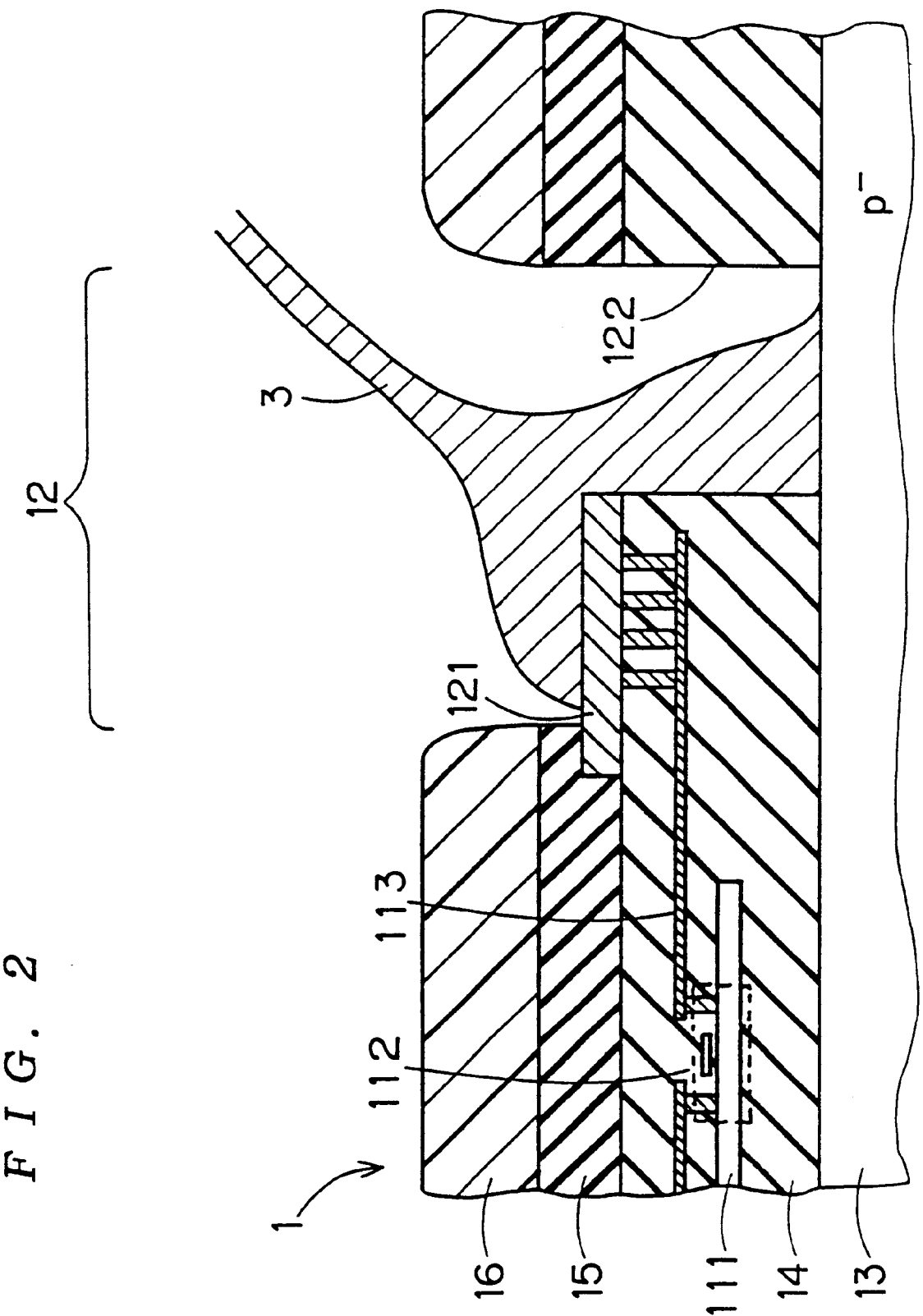
FIG. 2 is a sectional view showing the semiconductor device according to the first embodiment of the present invention.

Next, the bonding region 12 will be described with reference to FIG. 2. FIG. 2 is a sectional view showing the semiconductor device according to the first embodiment of the present invention, and illustrates a portion related to the bonding region 12 in FIG. 1. In FIG. 2, the reference numeral 13 denotes a semiconductor substrate, the reference numeral 14 denotes an insulator including a buried oxide film, an interlayer dielectric film and the like, the reference numeral 15 denotes a glass coat film, the reference numeral 16 denotes a polyimide film, the reference numeral 112 denotes a MOS transistor as a representative of an electronic circuit, the reference numeral 121 denotes a bonding pad (terminal) conducted to the electronic circuit, the reference numeral 122 denotes an opening reaching the semiconductor substrate 13 which is provided adjacently to the bonding region 12, and the reference numeral 113 denotes a wiring of the electronic circuit. The insulator 14 is formed between the semiconductor substrate 13 and the bonding pad 121, enclosing the electronic circuit, and exposed adjacently to the bonding pad 121 together with a region of a surface of the semiconductor substrate 13.

The bonding wire 3 is in contact with the bonding pad 121 and the semiconductor substrate 13 in common. Actually, the opening 122 has a small depth. Therefore, the bonding wire 3 can be caused to come in contact with the bonding pad 121 and the semiconductor substrate 13 in common by using a thermosonic bonding method, for example.

Figure 3:
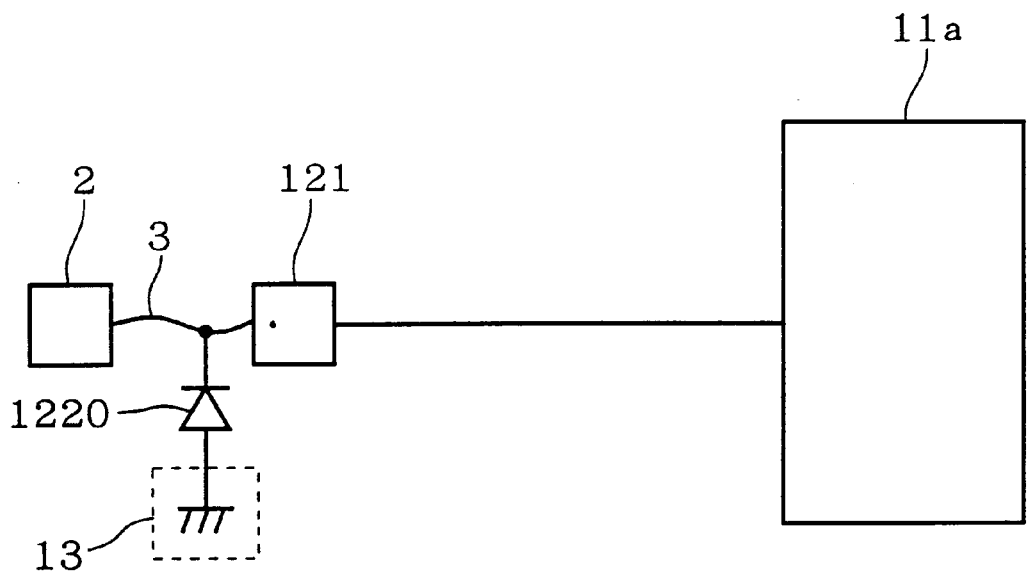
FIG. 3 is an equivalent circuit diagram showing the semiconductor device according to the first embodiment of the present invention.
Figure 4:
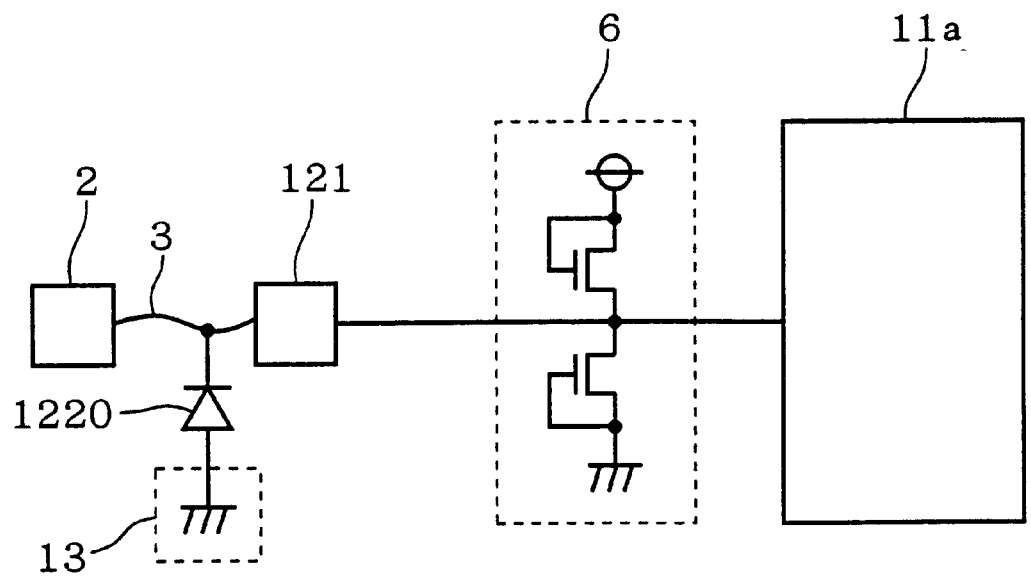
FIG. 4 is an equivalent circuit diagram showing the semiconductor device according to the first embodiment of the present invention.

FIG. 3 shows an equivalent circuit of a relevant portion. The reference numeral 11a denotes an electronic circuit formed in the SOI region 11. The bonding wire 3 and the semiconductor substrate 13 form a Schottky junction therebetween. Therefore, a diode 1220 having the semiconductor substrate 13 as an anode and the bonding wire 3 as a cathode is formed. It is preferable that a material of the bonding wire 3 forming the Schottky junction should be metal such as gold, aluminum or the like. A signal propagated through the bonding wire 3 is not sent to the semiconductor substrate 13. However, when a surge is propagated through the bonding wire 3, the diode 1220 breaks down so that the bonding wire 3 becomes conducted to the semiconductor substrate 13. As shown in FIG. 4, a protective circuit 6 for protecting the electronic circuit 11a from the surge may be provided on a SOI substrate other than the SOI region 11 formed between the electronic circuit 11a and the bonding pad 121.

According to the first embodiment, the surge propagated through the bonding wire 3 is effectively discharged into the semiconductor substrate 13. Consequently, the electronic circuit can be protected from the surge.

Second Embodiment

Figure 5:
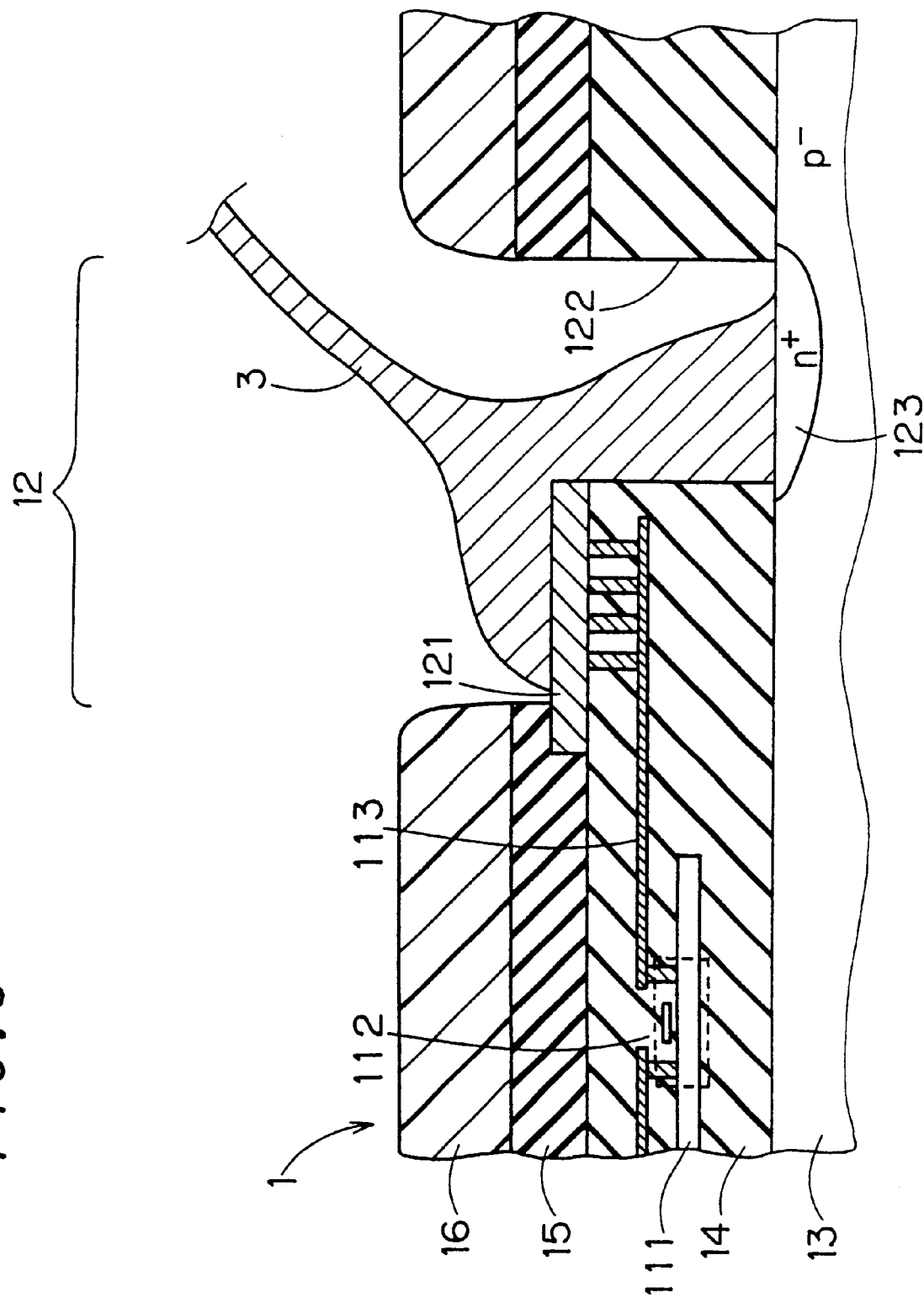
FIG. 5 is a sectional view showing a semiconductor device according to a second embodiment of the present invention.

Next, a second embodiment will be described. FIG. 5 is a sectional view showing a semiconductor device according to the second embodiment of the present invention, and illustrates a portion related to the bonding region 12 in FIG. 1. In FIG. 5, the reference numeral 123 denotes an impurity region in which an n-type impurity is implanted into a bottom of an opening 122, and others are the same as in the first embodiment.

In the second embodiment, a PN junction type diode having the impurity region 123 as a cathode and a p-type semiconductor substrate 13 as an anode is formed.

According to the second embodiment, the diode including the impurity region 123 and the semiconductor substrate 13 has a smaller resistance than in the diode described in the first embodiment. Therefore, a surge is discharged into the semiconductor substrate 13 more easily.

Third Embodiment

Figure 6:
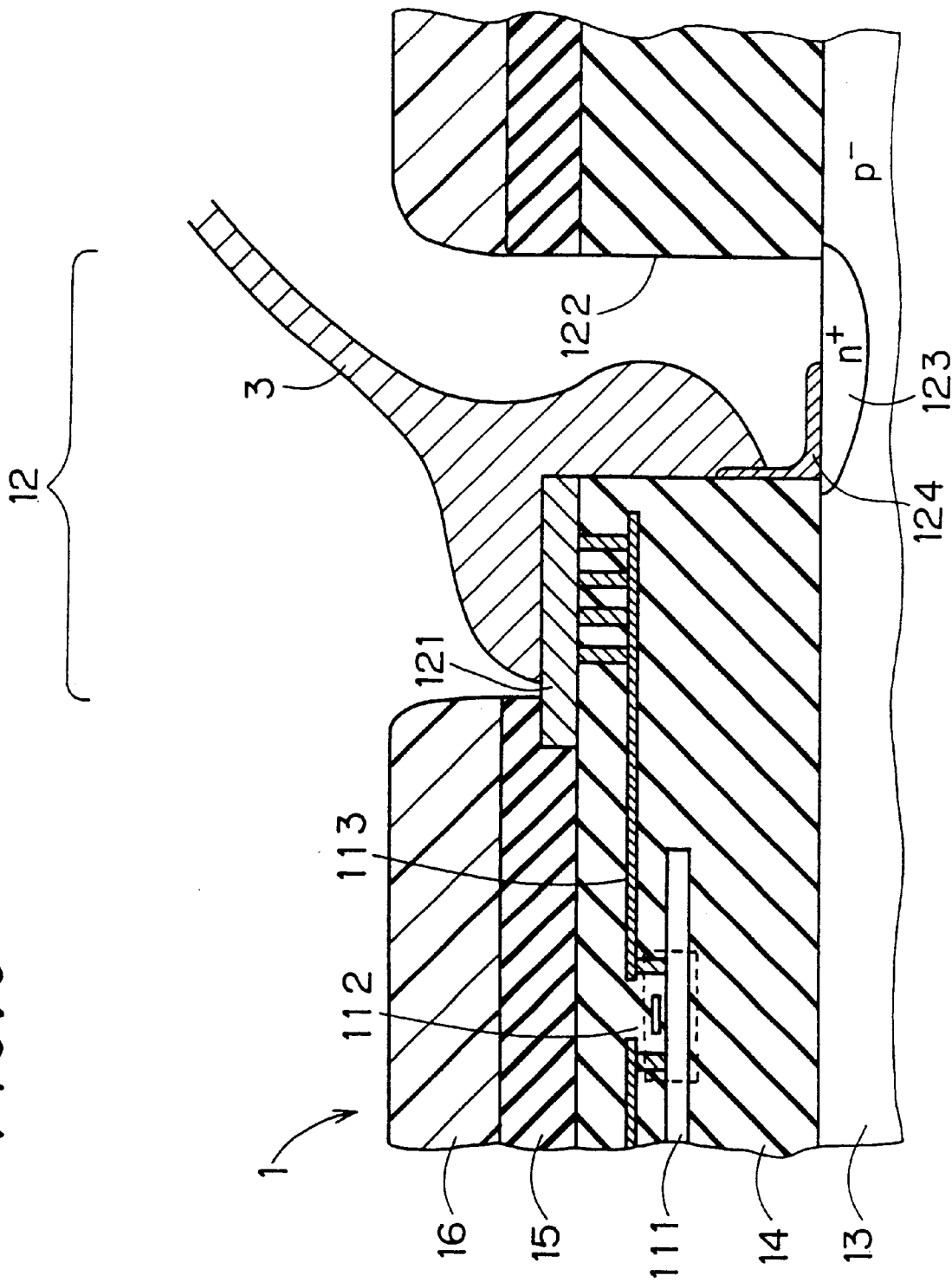
FIG. 6 is a sectional view showing a semiconductor device according to a third embodiment of the present invention.

For example, if a depth of the opening 122 is increased in FIG. 5, a bonding wire 3 comes in contact with the impurity region 123 with more difficulty. In a third embodiment, a conductive member 124 such as Al, Cu, TiN or W is formed over an insulator 14 and the impurity region 123 as shown in FIG. 6.

It is sufficient that the conductive member 124 is formed on at least a bottom of the opening 122 and a sidewall of the insulator 14. For example, the conductive member 124 may be formed as shown in FIGS. 7 to 10.

Figure 7:
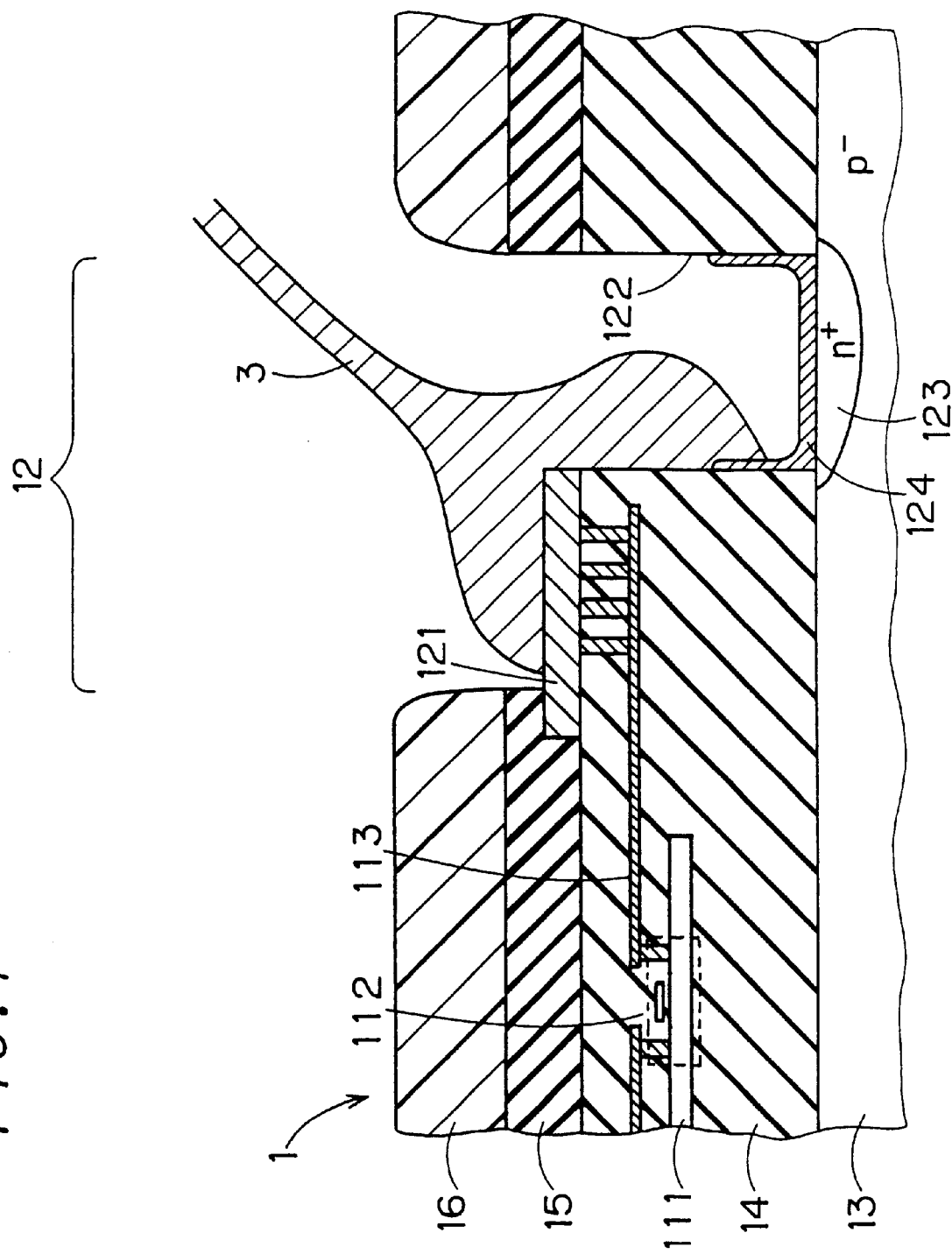
FIG. 7 is a sectional view showing the semiconductor device according to the third embodiment of the present invention.
Figure 8:
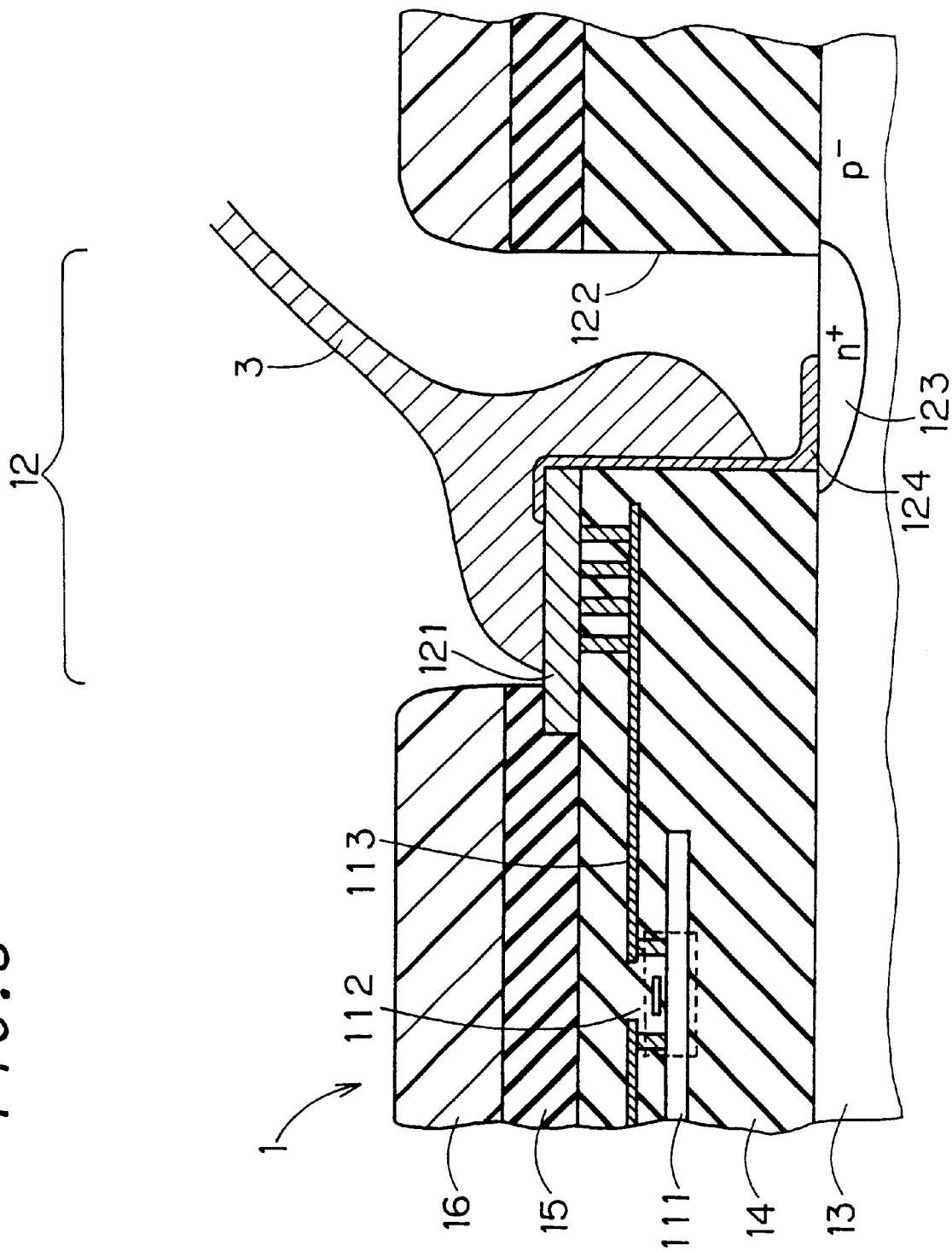
FIG. 8 is a sectional view showing the semiconductor device according to the third embodiment of the present invention.
Figure 9:
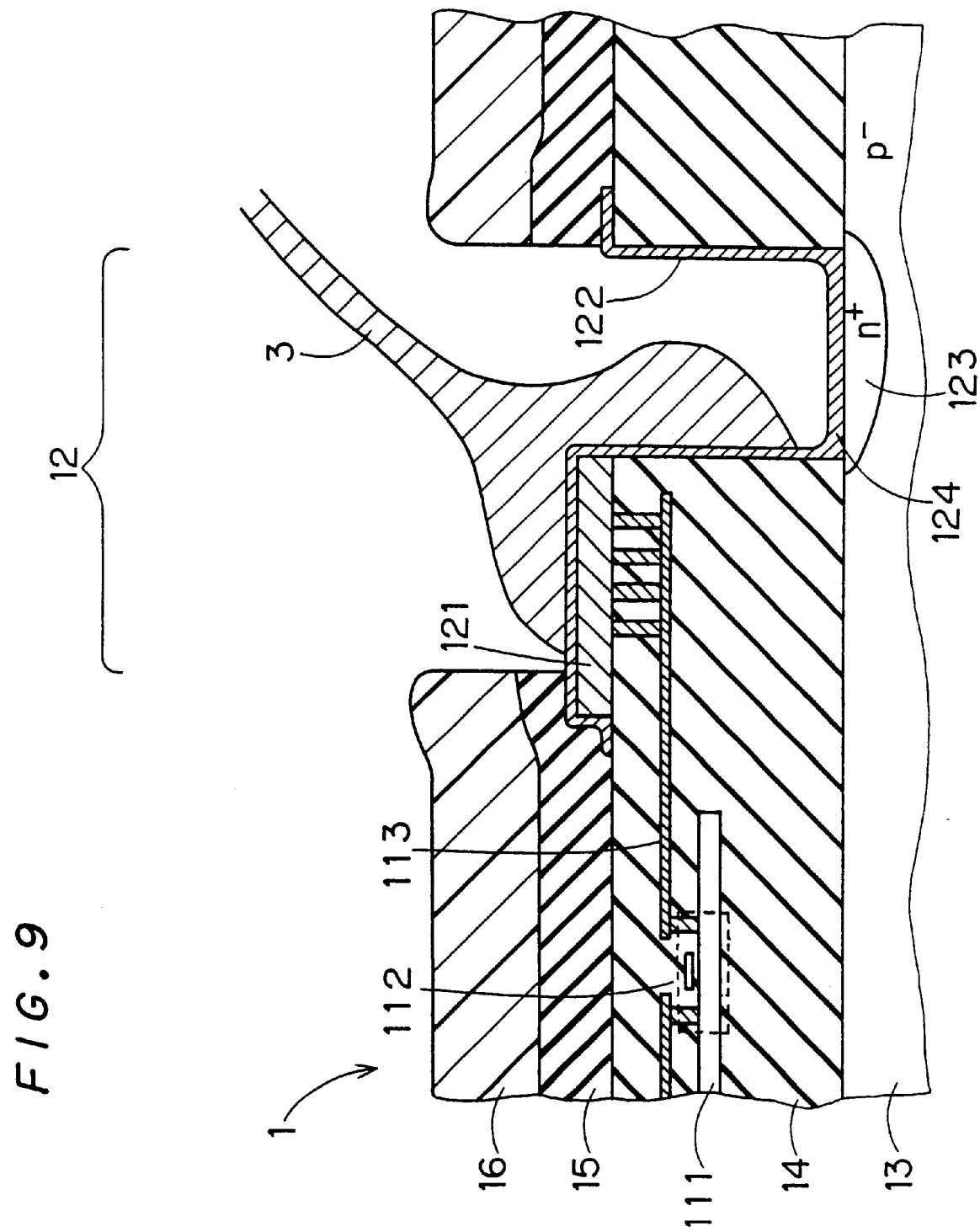
FIG. 9 is a sectional view showing the semiconductor device according to the third embodiment of the present invention.
Figure 10:
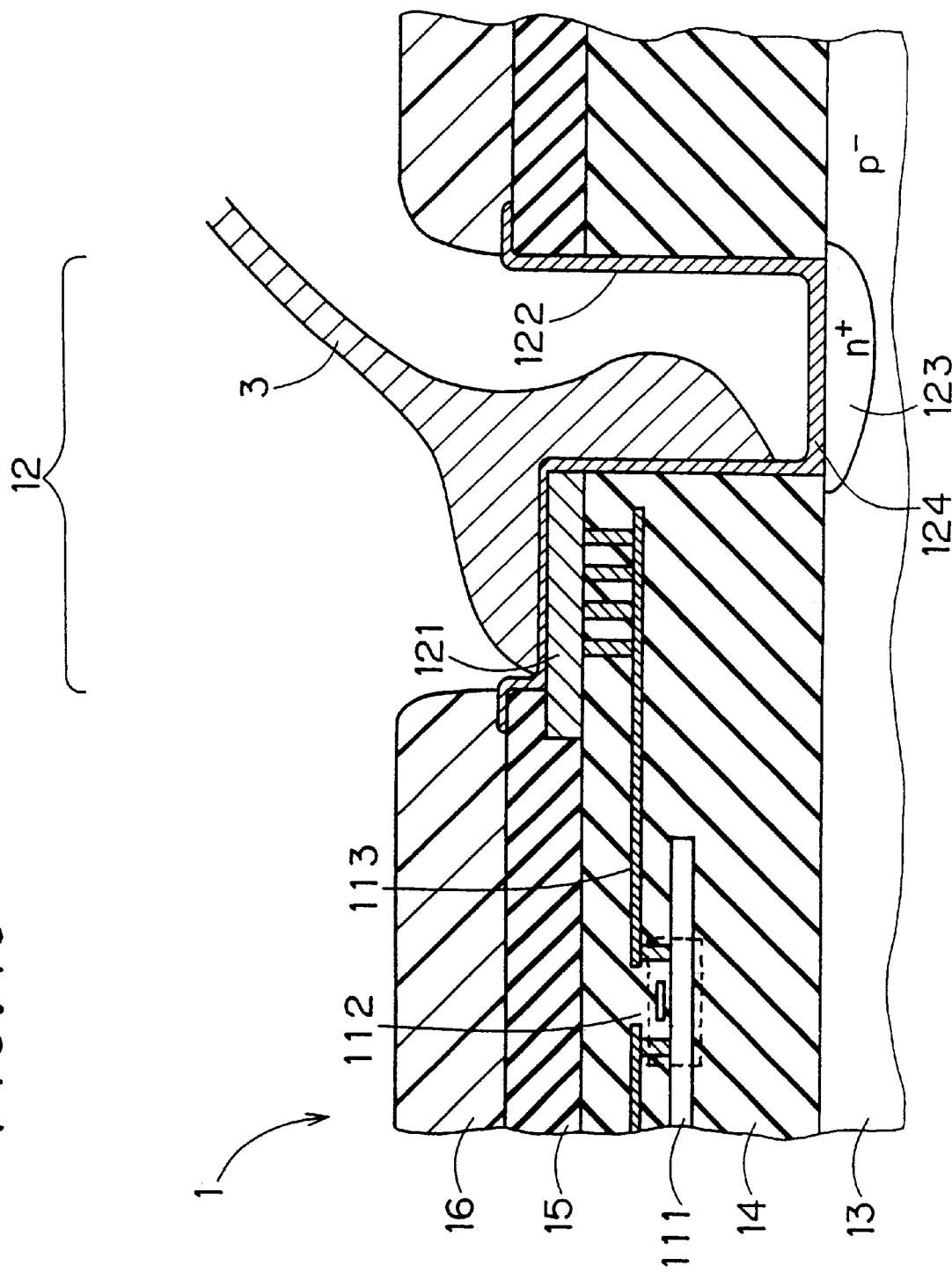
FIG. 10 is a sectional view showing the semiconductor device according to the third embodiment of the present invention.

FIGS. 9 and 10 show the conductive member 124 which is obtained by sputtering metal, forming a resist and etching an unnecessary portion of the metal. FIGS. 6 to 8 show the conductive member 124 obtained by using a focused ion beam repair system (hereinafter referred to as an FIB). In a case where the FIB is used, throughput is enhanced more if the number of bonding regions 12 is decreased, and the conductive member 124 can locally be formed as compared with a case where the sputtering or the like is performed as described above.

According to the third embodiment, the bonding wire 3 comes in contact with the conductive member 124 even if the opening 122 has a great depth. Therefore, electrical connection to a diode can be ensured.

Fourth Embodiment

Figure 11:
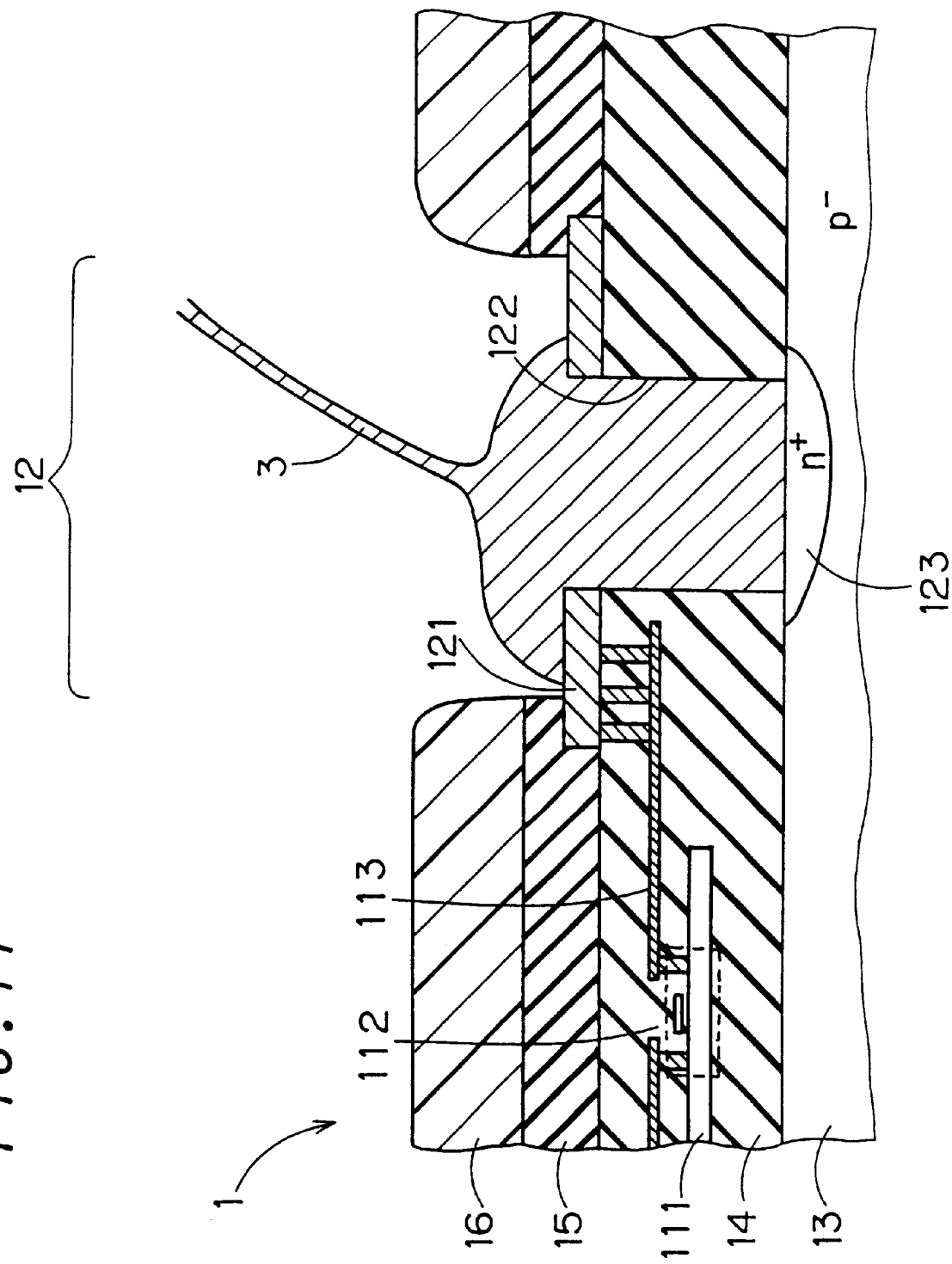
FIG. 11 is a sectional view showing a semiconductor device according to a fourth embodiment of the present invention.

In a fourth embodiment, an opening 122 is formed in a center of a bonding pad 121 as shown in FIG. 11. The opening 122 is enclosed by the bonding pad 121 as seen from above the bonding pad 121.

According to the fourth embodiment, the opening 122 is formed in the center of the bonding pad 121. Consequently, a bonding wire 3 easily comes in contact with a bottom of the opening 122 even if it is bonded toward the periphery of the bonding pad 121. Furthermore, the opening 122 is easily covered with the bonding wire 3 and an insulator 14 is not exposed. Therefore, it is possible to prevent the insulator 14 from absorbing moisture.

Fifth Embodiment

In a fifth embodiment, a method for manufacturing a semiconductor device according to the present invention will be described below. First of all, a wafer 10 having a structure shown in FIGS. 12A and 12B is obtained by using a well-known technique. In the wafer 10, a SOI substrate is covered with a glass coat film 15 and a polyimide film 16, and an electronic circuit is formed in a SOI region 11. Other designations correspond to the above-mentioned designations.

FIGS. 12A, 13A, 14A, 15A, 16A, 17A, 18A, 21A and 24A show a portion related to the bonding region 12 for a power supply Vdd or to the bonding region 12 for a signal, and FIGS. 12B, 13B, 14B, 15B, 16B, 17B, 18B, 21B and 24B show a portion related to the bonding region 12 for a ground Vss.

Figures 13A, 13B:
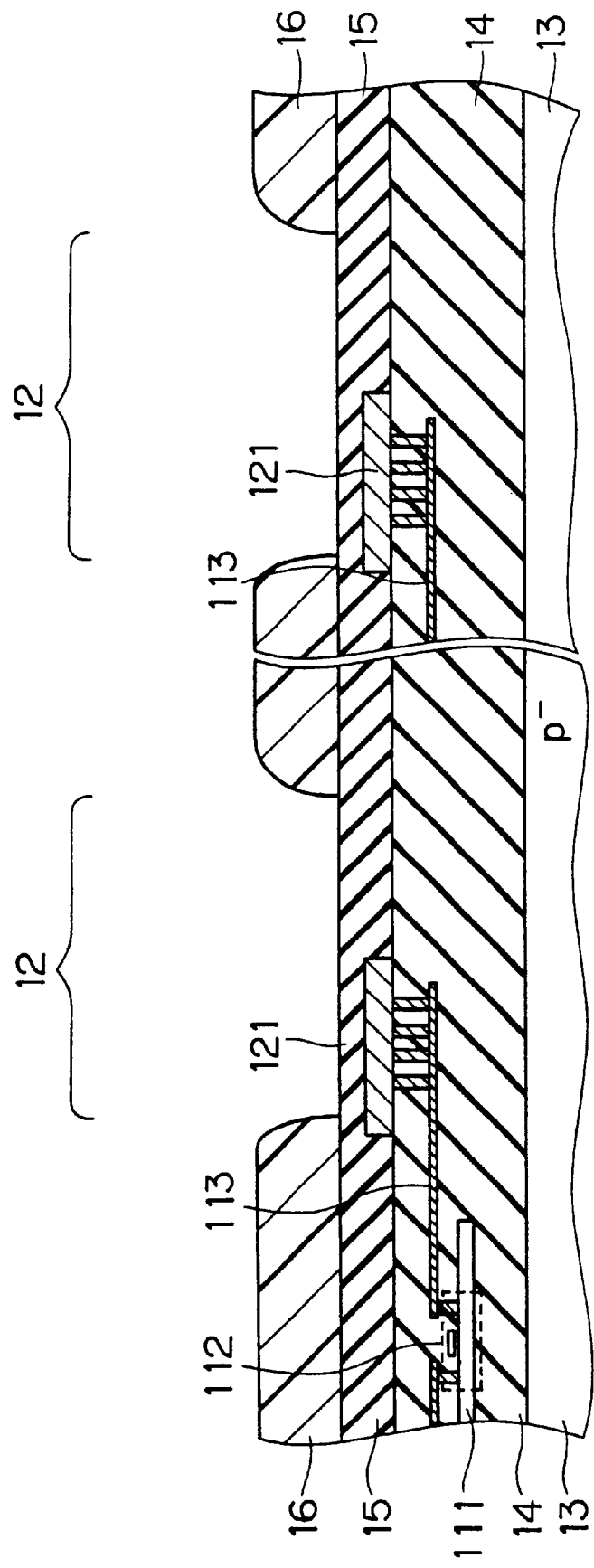
FIGS. 13A and 13B are sectional view showing the method for manufacturing the semiconductor device according to the fifth embodiment of the present invention.

Referring to a structure shown in FIGS. 12A and 12B, the polyimide film 16 is subjected to patterning so that the bonding region 12 is provided above a bonding pad 121 (FIGS. 13A and 13B).

Referring to a structure shown in FIGS. 13A and 13B, the glass coat film 15 is etched by using the polyimide film 16 as a mask. Consequently, the glass coat film 15 provided in the bonding region 12 is removed, and the bonding pad 121 and an insulator 14 are exposed (FIGS. 14A and 14B).

Referring to a structure shown in FIGS. 14A and 14B, the insulator 14 is etched by using the polyimide film 16 and the bonding pad 121 as masks. Consequently, an opening 122 reaching a semiconductor substrate 13 is formed on the insulator 14 to expose the semiconductor substrate 13 (FIGS. 15A and 15B).

Next, a resist 51 covering a portion other than the bonding region 12 for the Vdd or signal is formed and an n-type impurity is implanted. Consequently, an n-type impurity region 123 is provided on a bottom of the opening 122 for the Vdd or signal (FIGS. 16A and 16B).

Then, the resist 51 is removed. Thereafter, a resist 52 covering a portion other than the bonding region 12 for the Vss is formed and a p-type impurity is implanted. Consequently, a p-type impurity region 123 is provided on the bottom of the opening 122 for the Vss (FIGS. 17A and 17B).

Figure 19:
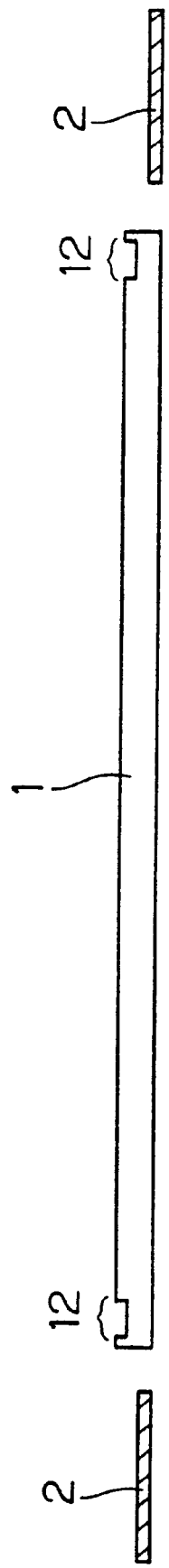
FIG. 19 is a sectional view showing the method for manufacturing the semiconductor device according to the fifth embodiment of the present invention.

Subsequently, the resist 52 is removed so that a structure shown in FIGS. 18A and 18B is obtained. The structure is cut into chips. Thus, a semiconductor chip 1 is formed. The semiconductor chip 1 and an external terminal 2 are prepared (FIG. 19).

Figure 20:
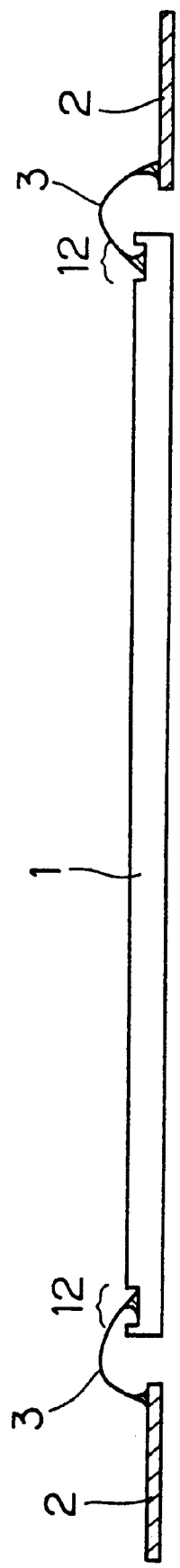
FIG. 20 is a sectional view showing the method for manufacturing the semiconductor device according to the fifth embodiment of the present invention.
Figure 21:
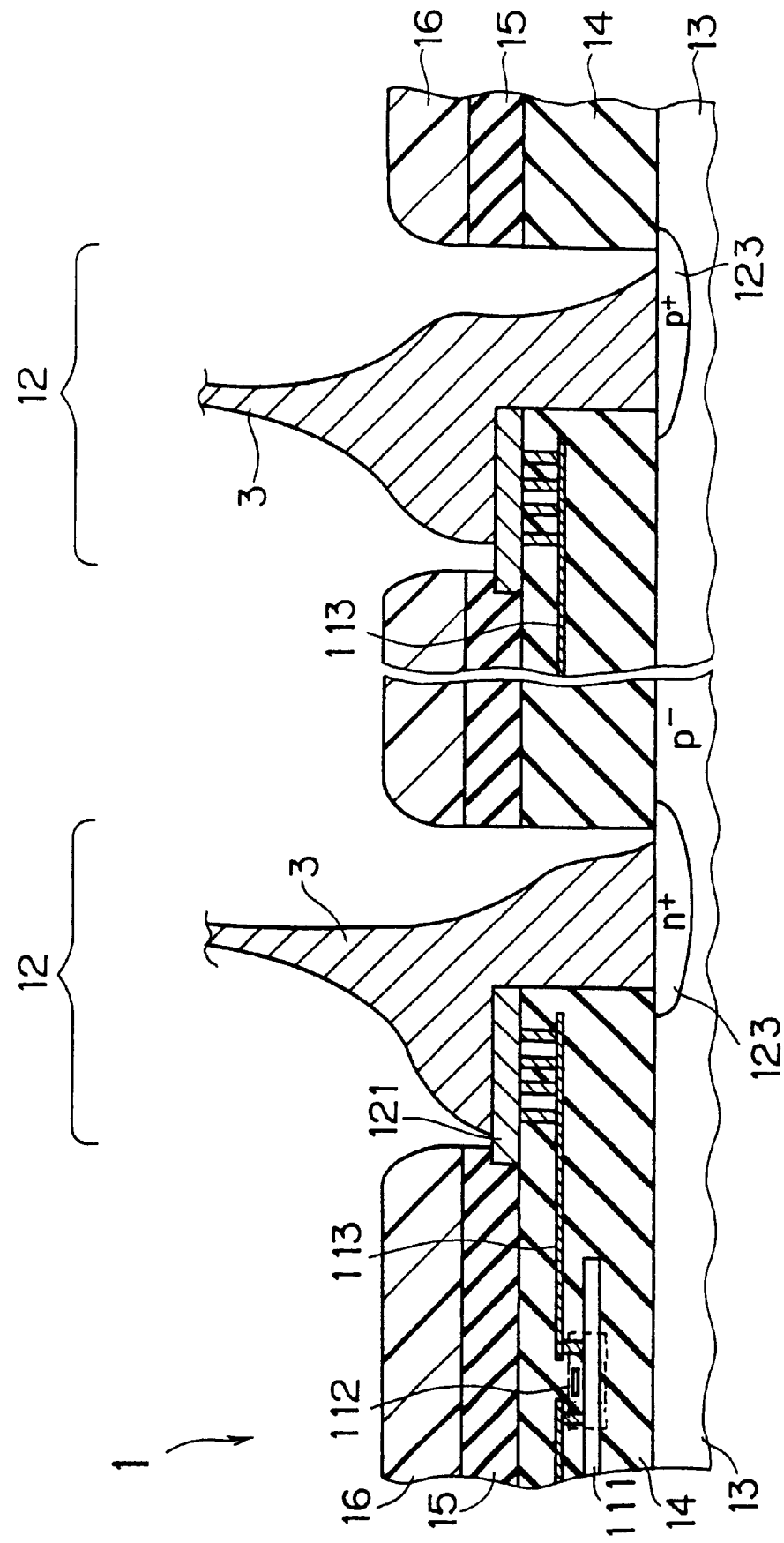
FIGS. 21A and 21B are sectional view showing the method for manufacturing the semiconductor device according to the fifth embodiment of the present invention.

Next, the bonding region 12 and the external terminal 2 are bonded through a bonding wire 3 (FIGS. 20, 21A and 21B). The bonding wire 3 is bonded to the external terminal 2, and is then bonded to the bonding region 12 of the semiconductor chip 1.

As described above, the external terminal 2 and the semiconductor chip 1 are electrically connected in this order. Therefore, the bonding wire 3 is bonded to the bonding region 12 in a state in which a surge generated during bonding is caused to flow to the external terminal 2. Consequently, an electronic circuit can be protected from the surge. Furthermore, the bonding wire 3 is bonded to the bonding region 12 and is connected to a diode having a p-type semiconductor substrate 13 as an anode and an n-type impurity region 123 as a cathode. Accordingly, even if the surge generated during the bonding is likely to flow from the bonding wire 3 to the electronic circuit, it actually flows to the semiconductor substrate 13 through the diode. Therefore, the electronic circuit can be protected from the surge. Such protection for the electronic circuit is effective in a case where the semiconductor chip 1 has no protective circuit.

Figure 22:
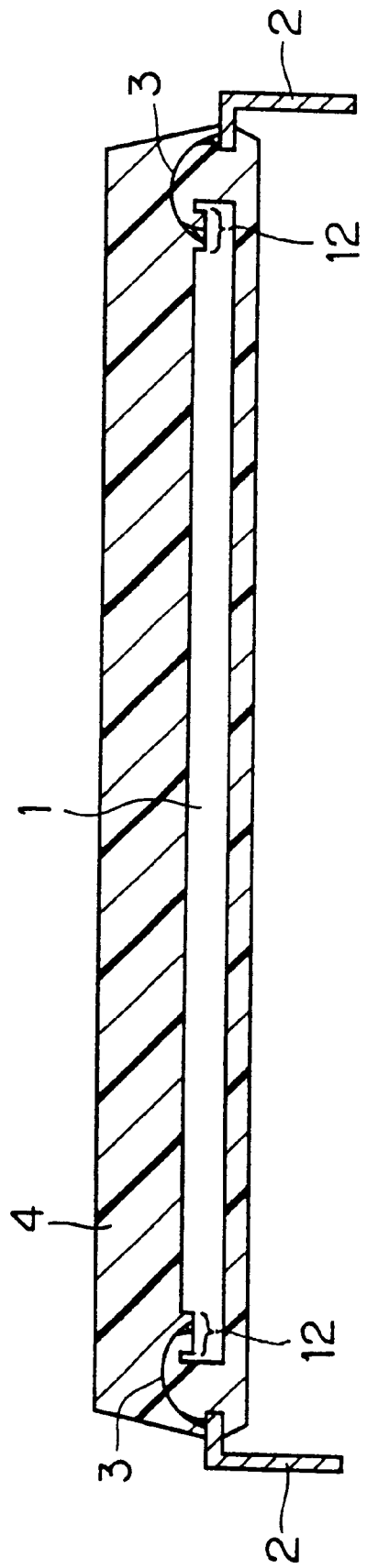
FIG. 22 is a sectional view showing the semiconductor device according to the fifth embodiment of the present invention.

Next, the external terminal 2, the bonding wire 3 and the semiconductor chip 1 are covered with a mold resin 4, and the external terminal 2 is subjected to framing. Thus, a semiconductor device is finished (FIG. 22).

If the formation and removal of the resists 51 and 52 and the ion implantation for forming the impurity region 123 are omitted, the semiconductor device according to the first embodiment can be obtained.

Figure 24:
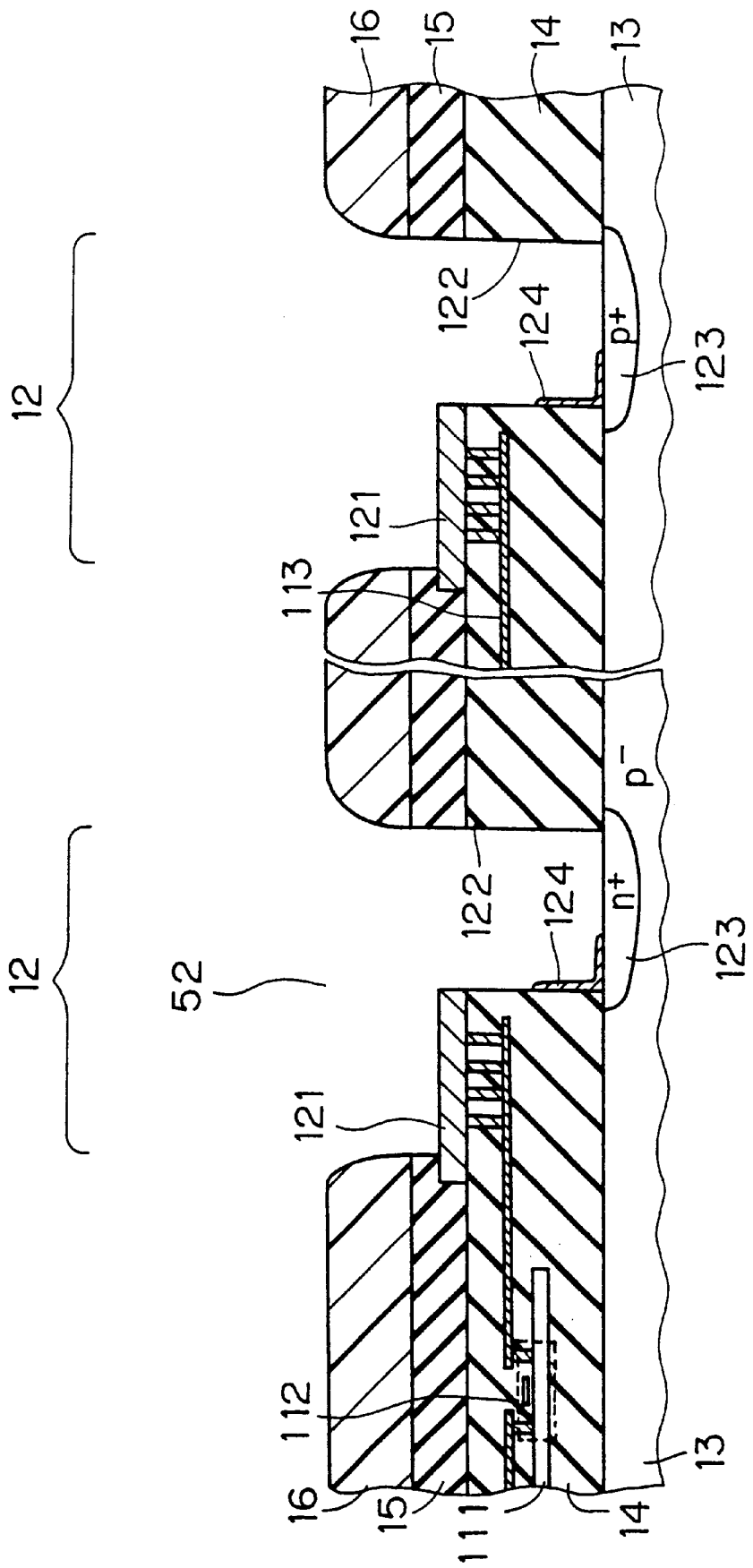
FIGS. 24A and 24B are sectional view showing the method for manufacturing the semiconductor device according to the fifth embodiment of the present invention.

The step of forming the conductive member 124 which has been described in the fourth embodiment may be added before the semiconductor chip I and the external terminal 2 shown in FIG. 19 are prepared. For example, it is preferable that the conductive member 124 should be formed by using an FIB immediately after the structure shown in FIGS. 18A and 18B is obtained (FIGS. 24A and 24B).

Furthermore, the opening 122 is provided in the bonding region 12 for the Vss so that the bonding wire 3 comes in contact with the semiconductor substrate 13. Therefore, an electric potential of a ground is given to the semiconductor substrate 13. The p-type impurity is implanted into the semiconductor substrate 13 on the bottom of the opening 122 for the Vss. Consequently, a resistance between the bonding wire 3 and the semiconductor substrate 13 is reduced.

Figure 23:
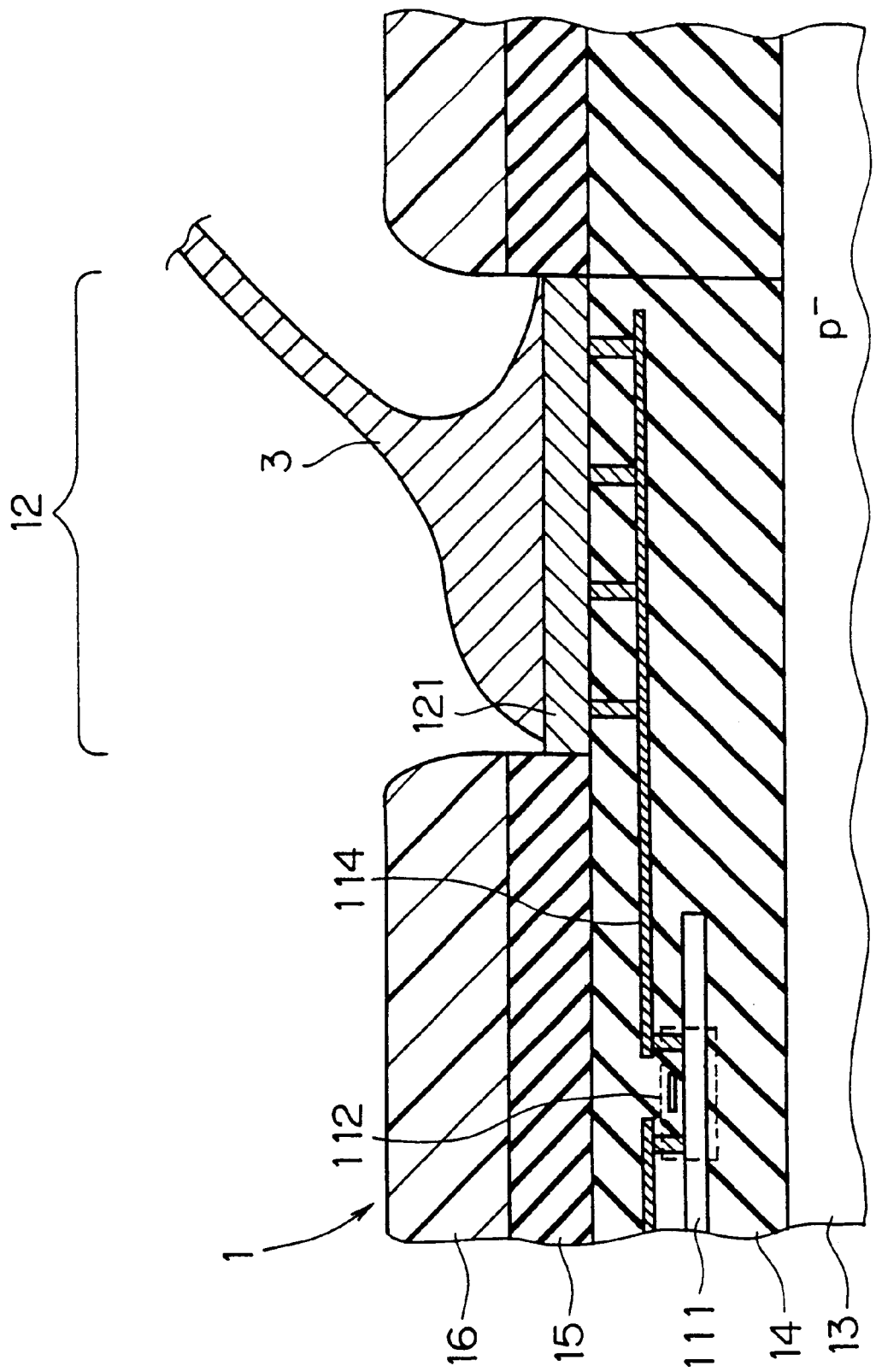
FIG. 23 is a sectional view showing the method for manufacturing the semiconductor device according to the fifth embodiment of the present invention.

In a semiconductor device to which a signal having a magnitude that is less than the ground Vss is sent, the opening 122 is not provided in the bonding region 12 as shown in FIG. 23 in such a manner that the signal is not sent from the semiconductor substrate 13.

According to the fifth embodiment, the surge generated during the bonding is discharged into the semiconductor substrate 13 even if it is likely to flow from the bonding wire 3 to the electronic circuit. Therefore, the electronic circuit can be protected from the surge. Furthermore, the external terminal 2 and the semiconductor chip 1 are electrically connected in this order. Consequently, the bonding wire 3 is bonded to the bonding region 12 in a state in which the surge can be caused to flow to the external terminal 2. Thus, the electronic circuit can be protected from the surge.

Sixth Embodiment

In the same manner as the above-mentioned electronic circuit, the protective circuit 6 is easily broken by a surge if it is provided on a SOI structure. In a sixth embodiment, the protective circuit 6 is provided on another substrate.

Figure 25:
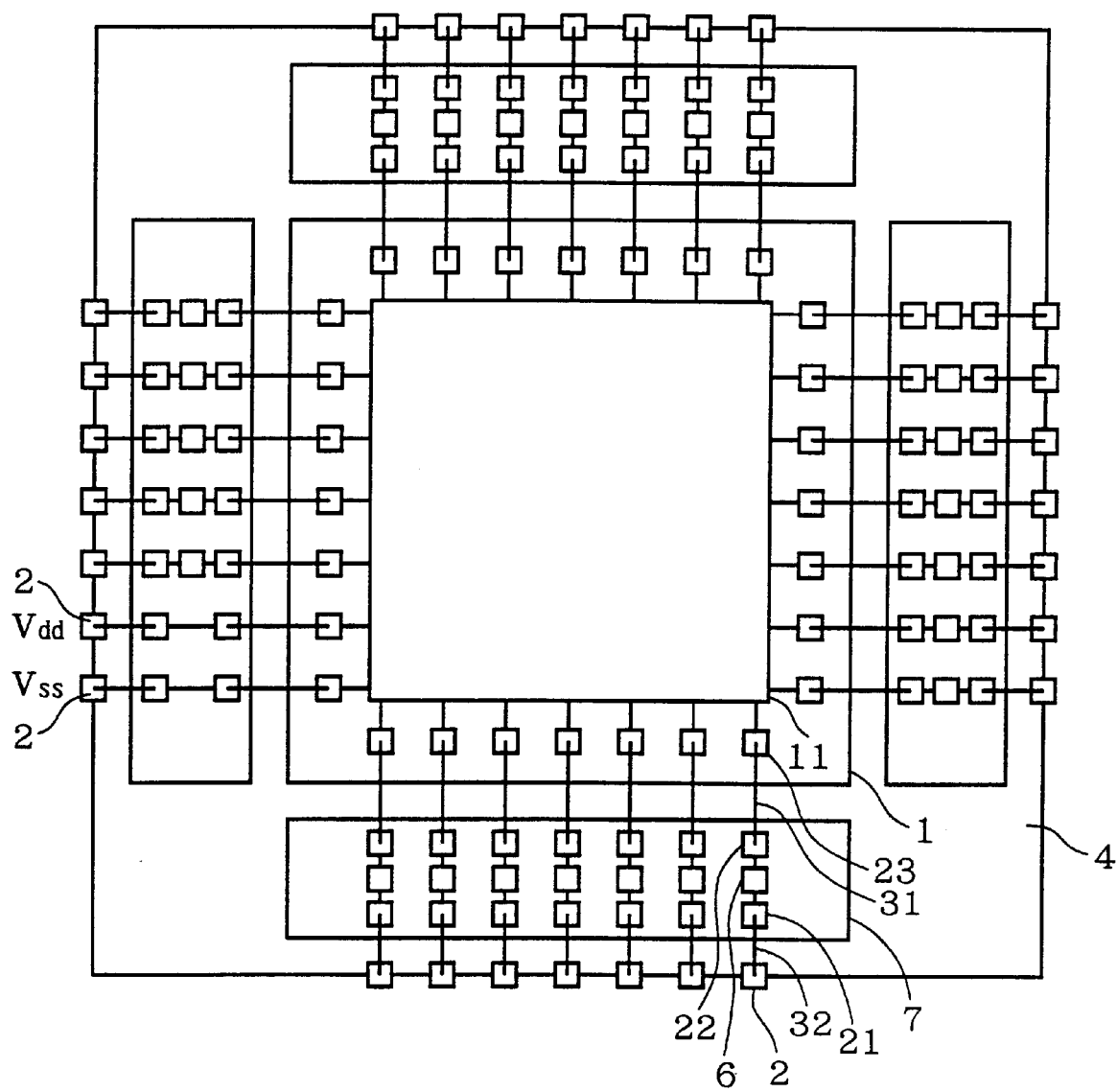
FIG. 25 is a conceptual view showing a semiconductor device according to a sixth embodiment of the present invention.

FIG. 25 is a plan view showing a semiconductor device according to the sixth embodiment of the present invention.

In FIG. 25, the reference numeral 23 denotes a bonding region provided on a semiconductor chip 1, the reference numeral 7 denotes a semiconductor substrate (protective substrate) for electrically protecting the SOI layer 111, the reference numerals 21 and 22 denote bonding regions formed on the semiconductor substrate 7, the reference numeral 31 denotes a bonding wire (first connecting member) bonded to the bonding regions 22 and 23, the reference numeral 32 denotes a bonding wire (second connecting member) bonded to an external terminal 2 and the bonding region 21, and other designations correspond to the above-mentioned designations. The protective circuit 6 is formed on the semiconductor substrate 7 and is connected to the bonding regions 21 and 22.

The power supply Vdd and ground Vss are supplied from the external terminals 2 for the power supply Vdd and ground Vss to the protective circuit 6 through wirings (not shown).

All the bonding regions 21, 22 and 23 may be formed as the bonding region 12 shown in FIG. 23. Alternatively, at least one of the bonding regions 21, 22 and 23 may be the bonding region 12 according to any of the first to fourth embodiments.

If the bonding region according to any of the first to fourth embodiments is applied to at least one of the bonding regions 21, 22 and 23, the protective circuit 6 to be provided on the semiconductor substrate 7 can be omitted because a diode formed by the bonding protects an electronic circuit from a surge.

Figure 26:
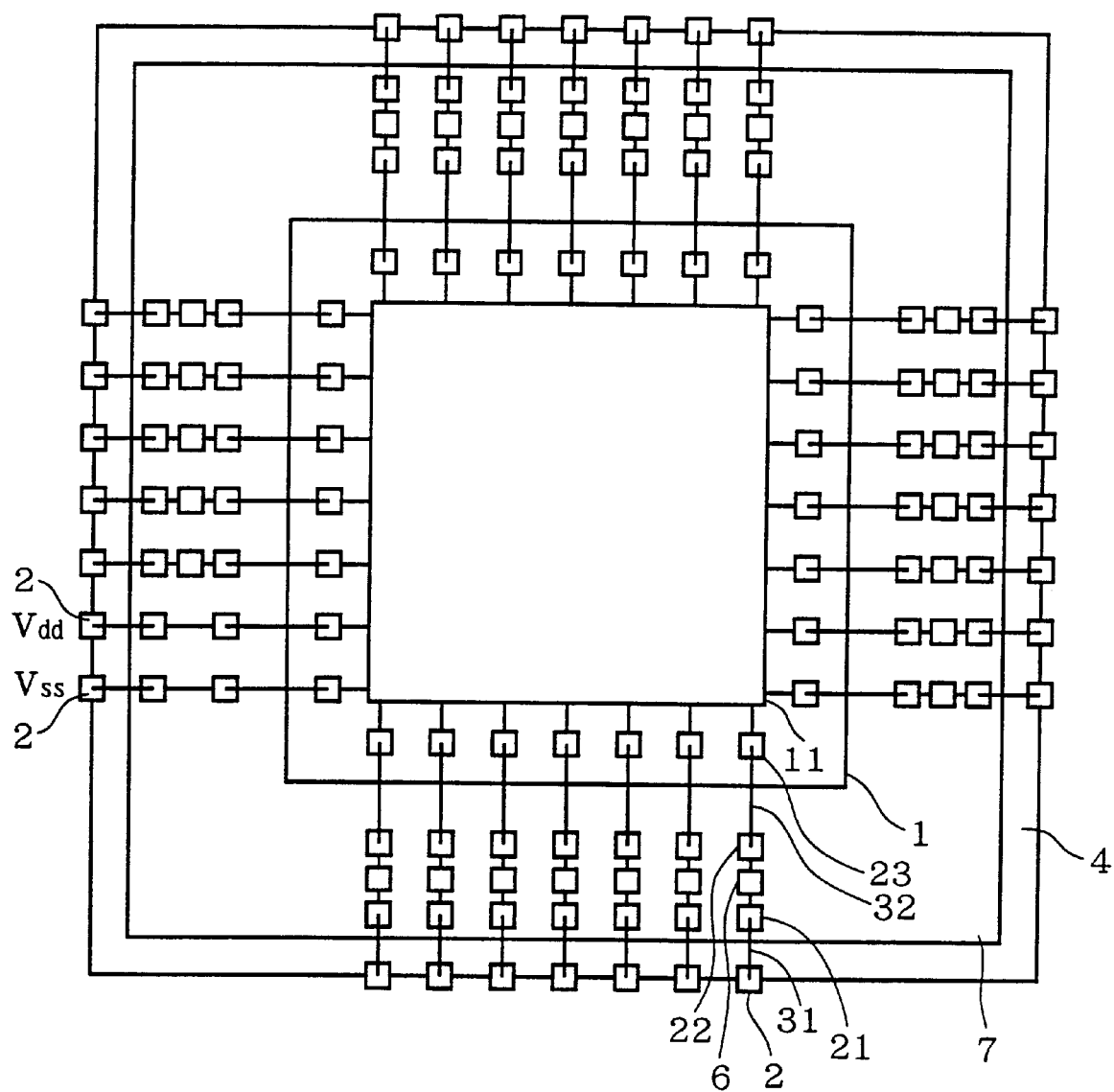
FIG. 26 is a conceptual view showing the semiconductor device according to the sixth embodiment of the present invention.
Figure 27:
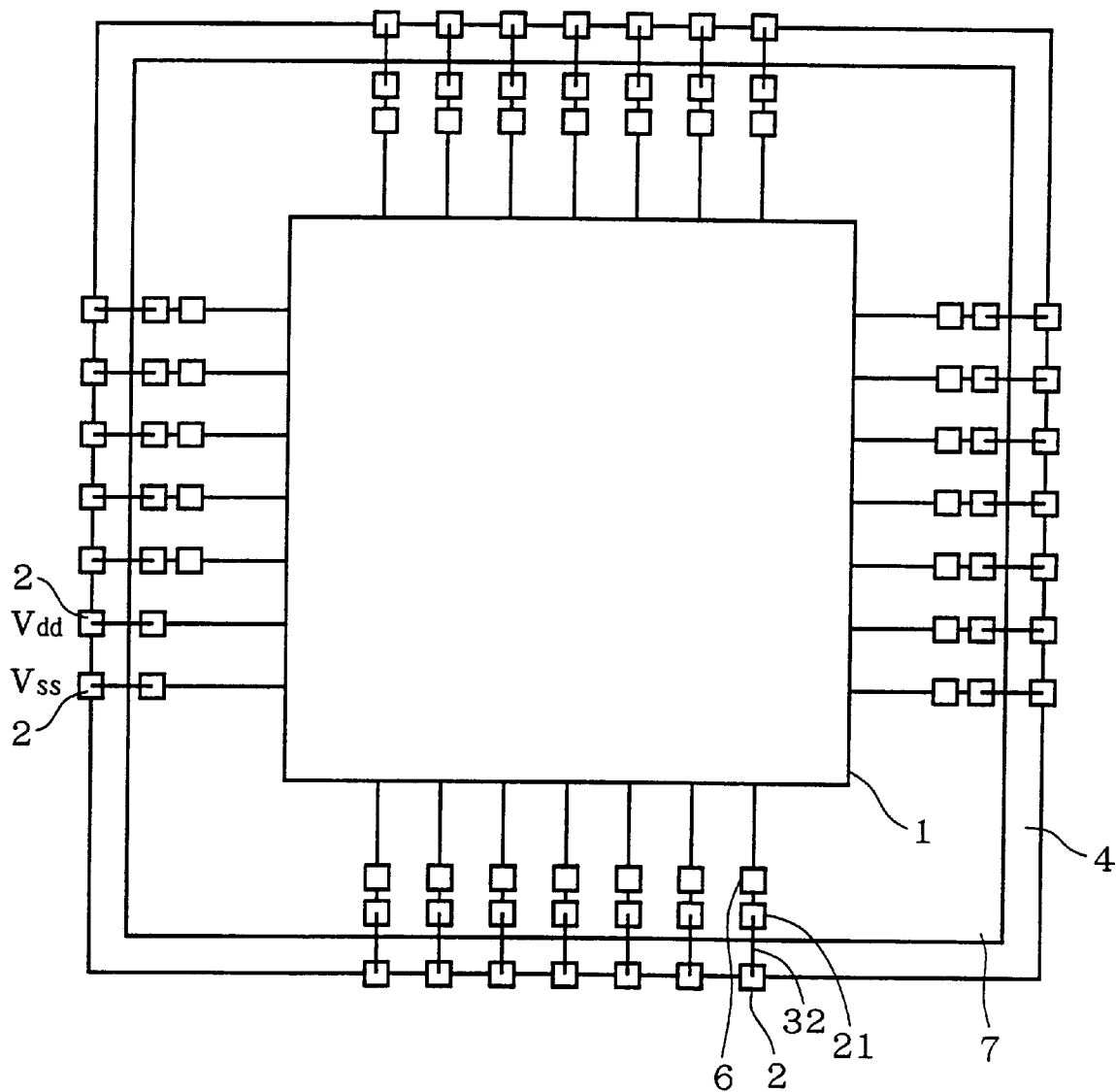
FIG. 27 is a conceptual view showing the semiconductor device according to the sixth embodiment of the present invention.
Figure 28:
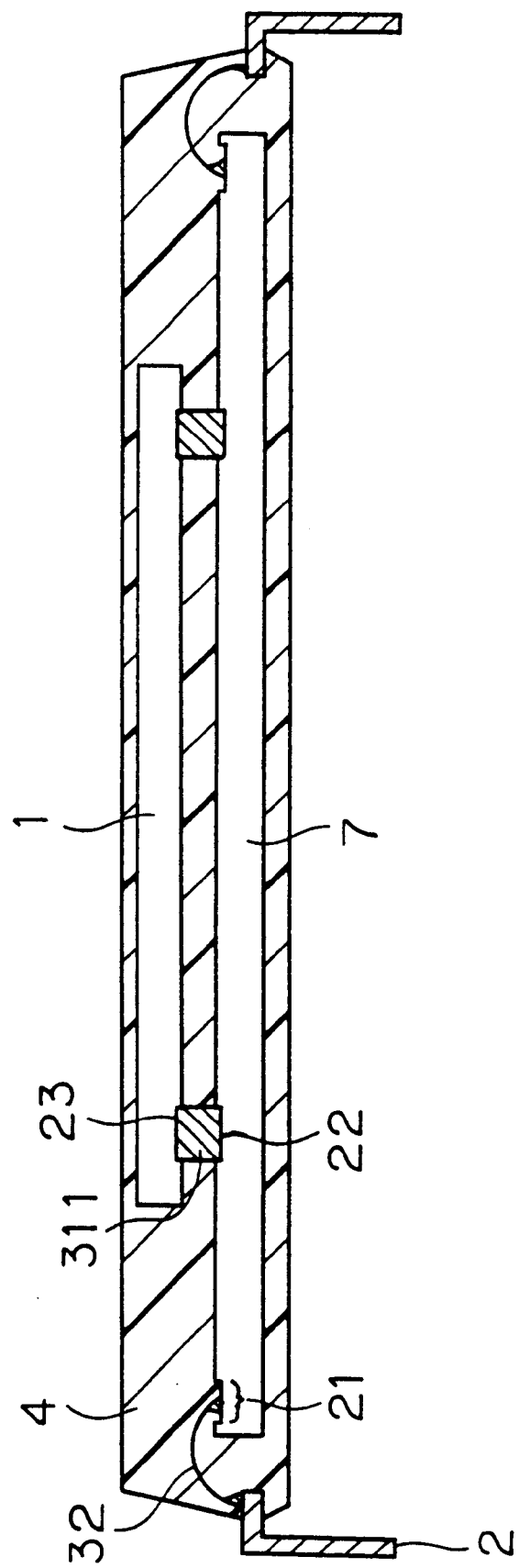
FIG. 28 is a sectional view showing the semiconductor device according to the sixth embodiment of the present invention.

In addition to the structure shown in FIG. 25, structures shown in FIGS. 26 to 28 may be formed. While four semiconductor substrates 7 are provided in FIG. 25, one semiconductor substrate 7 is provided and a semiconductor chip 1 is mounted on the semiconductor substrate 7 in FIG. 26. In FIG. 27, a flip-chip method is applied. FIG. 28 shows a section of FIG. 27. In FIG. 28, the reference numeral 311 denotes a bump (first connecting member) such as gold, aluminum, solder or the like which electrically connects bonding regions 23 and 22. By the flip-chip method, a large number of bonding regions 23 and 22 can electrically be connected at a time. Therefore, throughput can be enhanced.

According to the sixth embodiment, a surge flows into the semiconductor substrate 7. Therefore, the electronic circuit provided on the semiconductor chip 1 can be protected from the surge.

Seventh Embodiment

Figure 29:
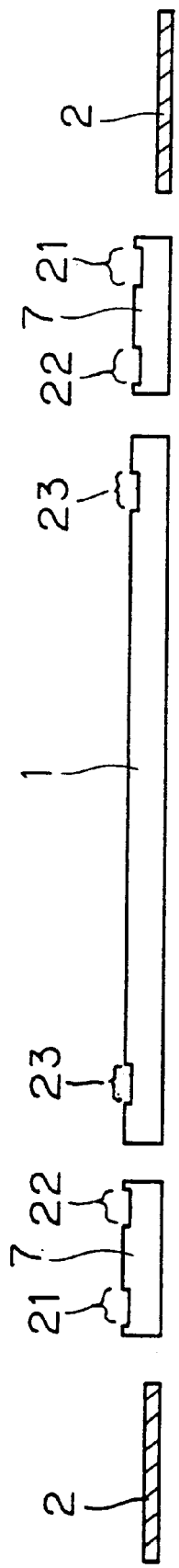
FIG. 29 is a sectional view showing a method for manufacturing a semiconductor device according to a seventh embodiment of the present invention.

In a seventh embodiment, a method for manufacturing the semiconductor device according to the sixth embodiment will be described below. First of all, a semiconductor chip 1, a semiconductor substrate 7 and an external terminal 2 are prepared (FIG. 29).

Figure 30:
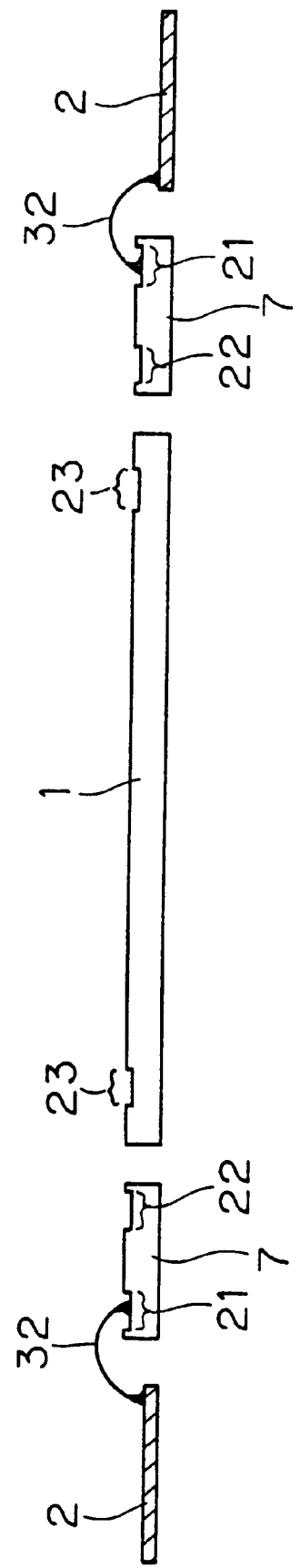
FIG. 30 is a sectional view showing the method for manufacturing the semiconductor device according to the seventh embodiment of the present invention.
Figure 31:
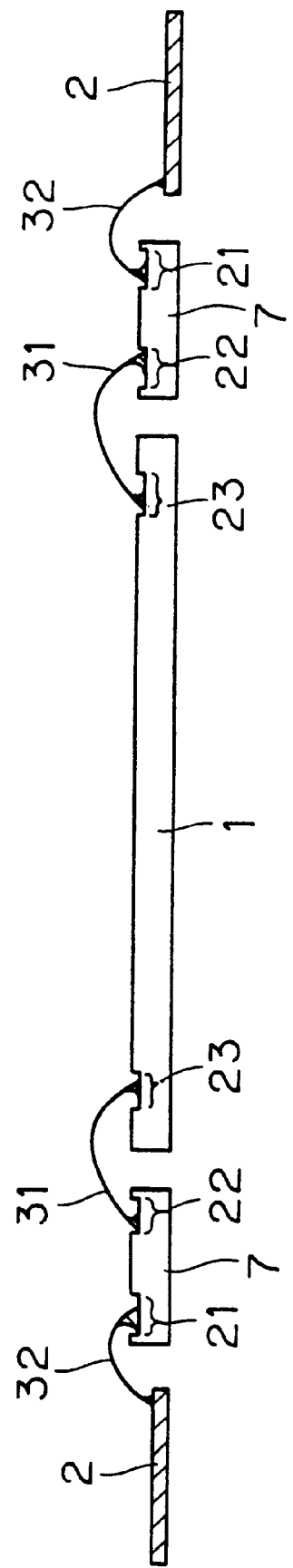
FIG. 31 is a sectional view showing the method for manufacturing the semiconductor device according to the seventh embodiment of the present invention.
Figure 33:
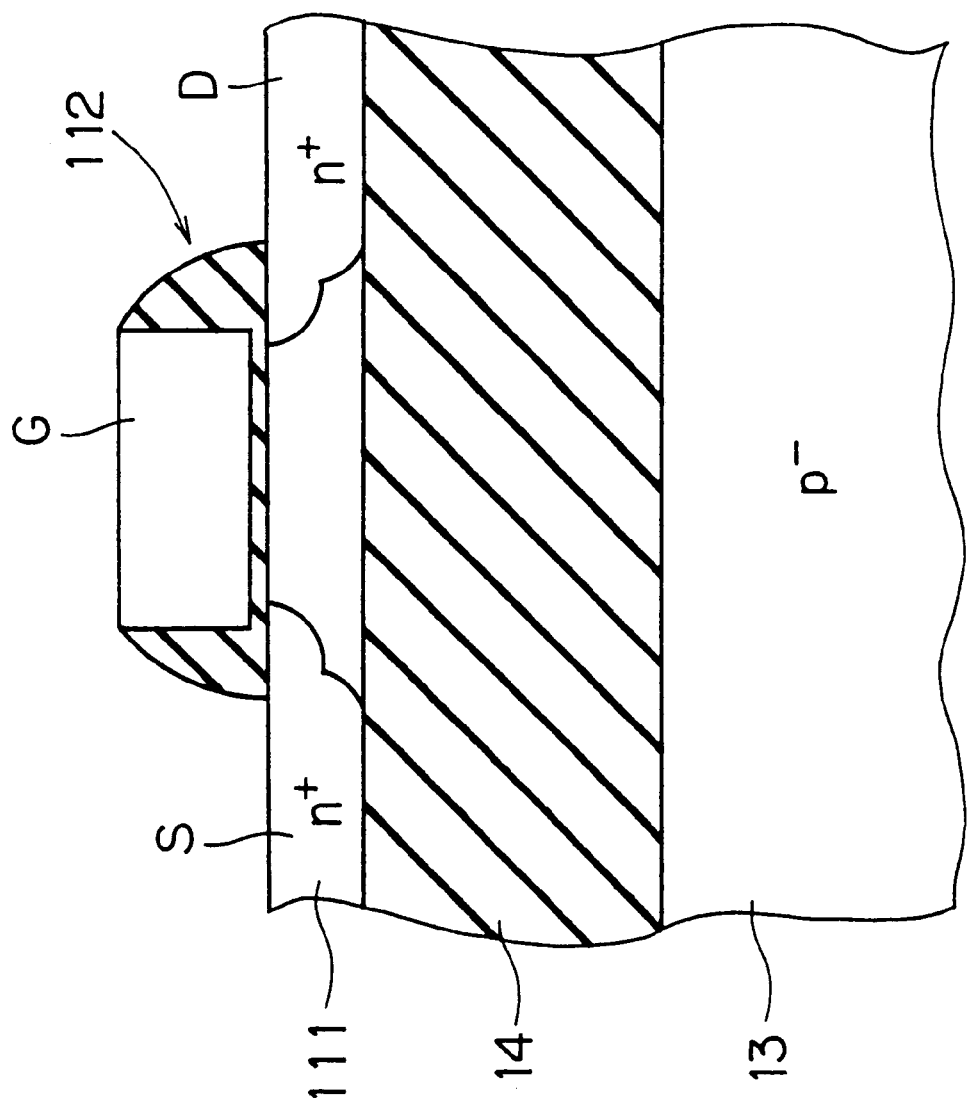
FIG. 33 is a sectional view showing a SOI structure.

Next, a bonding wire 32 is bonded to the external terminal 2, and is then bonded to a bonding region 21 (FIG. 30). Subsequently, a bonding wire 31 is bonded to a bonding region 22, and is then bonded to a bonding region 23 (FIG. 31). Thus, the external terminal 2, the semiconductor substrate 7 and the semiconductor chip 1 are electrically connected in this order. Therefore, the bonding wire 31 is electrically connected to the semiconductor substrate 7 and the external terminal 2 when it is bonded to the bonding region 23. Consequently, an electronic circuit can be protected from a surge generated during the bonding.

Then, the external terminal 2, the bonding wire 31, the bonding wire 32, the semiconductor chip 1 and the semiconductor substrate 7 are covered with a mold resin 4, and the external terminal 2 is subjected to framing. Thus, a semiconductor device is finished (FIG. 32).

According to the seventh embodiment, the external terminal 2, the semiconductor substrate 7 and the semiconductor chip 1 are electrically connected in this order. Therefore, the electronic circuit can be protected from the surge generated during the bonding.

Variant

Figure 34:
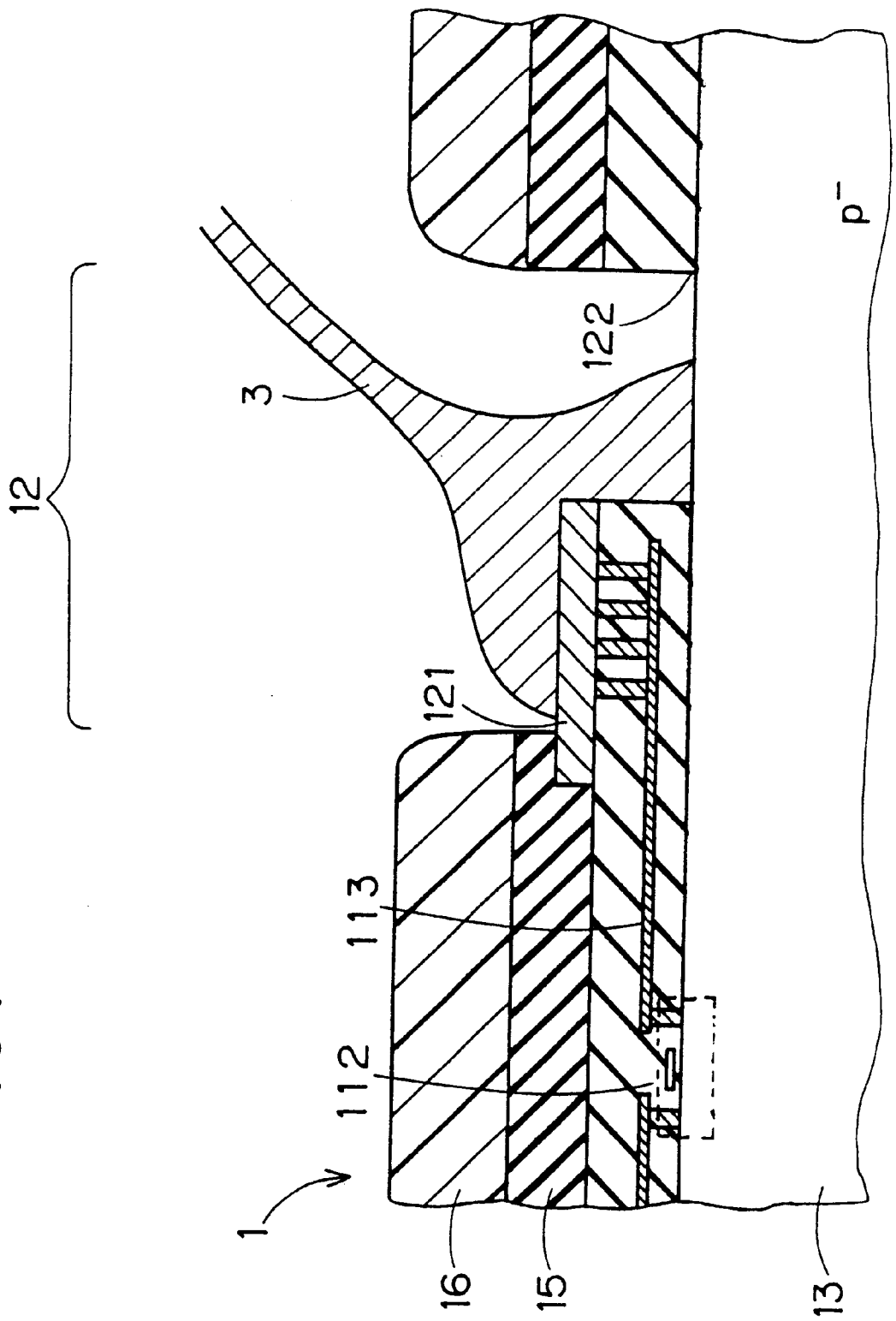
FIG. 34 is a sectional view showing a case where the present invention is applied to a semiconductor substrate having a structure other than the SOI structure.

While a case where the electronic circuit is provided on the SOI structure has been described above, the electronic circuit may be provided on a semiconductor substrate which does not have the SOI structure. For example, the present invention may be applied to a structure in which a MOS transistor 112 constituting an electronic circuit is formed on a semiconductor substrate 13 as shown in FIG. 34.

While the invention has been described in detail, the foregoing description is in all aspects illustrative and not restrictive. It is understood that numerous other modifications and variations can be devised without departing from the scope of the invention.

I claim:

1. A method for manufacturing a semiconductor device, comprising the steps of:
   (a) preparing a semiconductor substrate, an insulating film formed on said semiconductor substrate, a semiconductor layer formed on said insulating film and having an electronic circuit formed thereon, a terminal conducted to said electronic circuit, and an external terminal;
   (b) forming an opening on a region of said insulating film in which said semiconductor layer is not formed in an upper part to expose said semiconductor substrate;
   (c) connecting one of ends of a metal connecting member to said external terminal; and
   (d) bonding the other end of said connecting member to said exposed semiconductor substrate and said terminal.

2. The method for manufacturing a semiconductor device according to claim 1, further comprising, between said steps (b) and (c), a step of:
   (e) making a conductivity type of a surface of said exposed semiconductor substrate different from that of said semiconductor substrate.

3. A method for manufacturing a semiconductor device, comprising the steps of:
   (a) preparing a semiconductor substrate, an insulating film formed on said semiconductor substrate, a semiconductor layer formed on said insulating film and having an electronic circuit formed thereon, a terminal conducted to said electronic circuit, and an external terminal;
   (b) forming an opening on said insulating film to expose said semiconductor substrate;
   (c) making a conductivity type of a surface of said exposed semiconductor substrate different from that of said semiconductor substrate;
   (d) forming a conductive member from said surface of said exposed semiconductor substrate to a sidewall of said opening;
   (e) connecting one of ends of a metal connecting member to said external terminal; and
   (f) bonding the other end of said connecting member to said exposed semiconductor substrate and said terminal.

4. A method for manufacturing a semiconductor device, comprising the steps of:

(a) preparing a semiconductor substrate, an insulating film formed on said semiconductor substrate, a semiconductor layer formed on said insulating film and having an electronic circuit formed thereon, a terminal conducted to said electronic circuit, and an external terminal;

(b) forming an opening on said insulating film to expose said semiconductor substrate;

(c) connecting one of ends of a metal connecting member to said external terminal; and (d) bonding the other end of said connecting member to said exposed semiconductor substrate and said terminal, wherein said electronic circuit is provided on a SOI structure.

* * * * *